United States Patent
Tong et al.

(10) Patent No.: US 7,831,883 B2
(45) Date of Patent: Nov. 9, 2010

(54) LDPC ENCODERS, DECODERS, SYSTEMS AND METHODS

(75) Inventors: Wen Tong, Ottawa (CA); Ming Jia, Ottawa (CA); Peiying Zhu, Kanata (CA); Jianglei Ma, Kanata (CA); Claude Royer, Hull (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 1073 days.

(21) Appl. No.: 11/547,078

(22) PCT Filed: Apr. 4, 2005

(86) PCT No.: PCT/CA2005/000505
§ 371 (c)(1),
(2), (4) Date: Oct. 2, 2006

(87) PCT Pub. No.: WO2005/096510
PCT Pub. Date: Oct. 13, 2005

(65) Prior Publication Data
US 2009/0083604 A1    Mar. 26, 2009

Related U.S. Application Data

(60) Provisional application No. 60/558,566, filed on Apr. 2, 2004, provisional application No. 60/563,815, filed on Apr. 21, 2004.

(51) Int. Cl.
*H03M 13/00* (2006.01)
(52) U.S. Cl. .......... 714/752; 714/758
(58) Field of Classification Search ........ 714/752, 714/758
See application file for complete search history.

(56) References Cited

U.S. PATENT DOCUMENTS

| 6,453,442 | B1 | 9/2002 | Sadjadpour et al. |
| 7,116,710 | B1 * | 10/2006 | Jin et al. ............ 375/240 |
| 7,210,075 | B2 | 4/2007 | Ferrari et al. |
| 7,568,145 | B2 | 7/2009 | Dinoi et al. |
| 2005/0111564 | A1 * | 5/2005 | Kramer et al. ...... 375/265 |
| 2005/0246615 | A1 * | 11/2005 | Matsumoto ......... 714/801 |

OTHER PUBLICATIONS

Abbasfar et al. Accumulate Repeat Accumulate Codes, University of California Los Angeles, Dec. 2, 2003. pp. 1-6.*

* cited by examiner

*Primary Examiner*—Sam Rizk

(57) ABSTRACT

An LDPC encoder with a complexity that increases linearly as a function of block size is provided. They are implementable with simple logic consisting of a repeater with an irregular repeat pattern, an interleaver, and an accumulator that performs irregular accumulations.

16 Claims, 39 Drawing Sheets

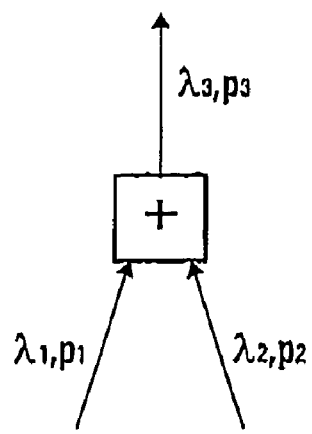
FIG. 6
|  | $p_2$ | $1-p_2$ |
|---|---|---|
| $p_1$ | + | − |
| $1-p_1$ | − | + |
FIG. 7
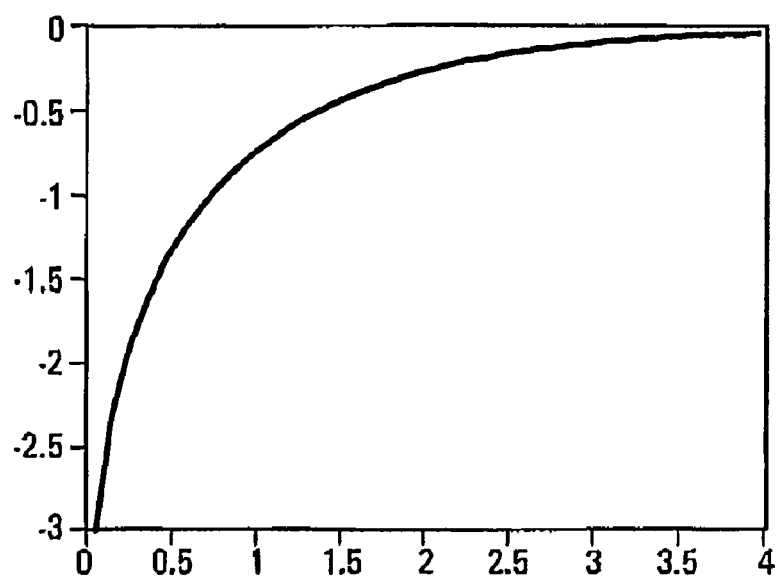
FIG. 8

LDPC ENCODERS, DECODERS, SYSTEMS AND METHODS

This application claims the benefit of PCT Application No. PCT/CA2005/000505 filed Apr. 4, 2005. This application claims the benefit of U.S. Provisional Application Nos. 60/558,566 filed Apr. 2, 2004 and 60/563,815 filed Apr. 21, 2004, hereby incorporated by reference in their entirety.

FIELD OF THE INVENTION

The invention relates to LDPC encoders, decoders, systems and methods.

BACKGROUND OF THE INVENTION

It has been demonstrated by a number of research works that the performance of LDPC (low density parity check) codes exceed that of the turbo code, and can be as little as 0.045 dB below the Shannon limit. The algorithm used for message passing allows parallel calculations and requires less memory and calculation costs than the turbo decoding algorithm.

The message passing algorithm is based upon the property of the parity check matrix H of the linear block code including the following: any valid code word multiplied at the parity check matrix results in the zero vector. Another important property of the check matrix is that it is sparse, and the number of units in the matrix is a linear function of the code word size. Hence, the decoding complexity is a linear function of the code word length.

The availability of efficient decoding algorithms does not guarantee the availability of efficient encoding algorithms. As known from the theory of linear block codes, a generation matrix G is typically used to encode message. The generation matrix G related to the check matrix H as $HG^T=0 \mod 2$. The encoding complexity increases in quadratic proportion to the encoded block. In order to encode the code word with a length $\sim 10^3$, the required number of operations is $\sim 10^6$, and this would be difficult for practical application. One way to resolve this issue is to take advantage of the code concept RA-IRA (repeat accumulative-irregular repeat accumulative) that uses linear time encoding.

SUMMARY OF THE INVENTION

According to one broad aspect, the invention provides an LDPC encoder with linear complexity adapted to produce a systematic output and a parity output, the encoder comprising: a repeater that implements an irregular repetition code; an interleaver that performs interleaving on the repeater output; an accumulator performing accumulations on outputs of the interleaver and outputting the parity output.

In some embodiments, the interleaver is either an S-random or congruential interleaver.

In some embodiments, the accumulator performs irregular accumulations.

In some embodiments, the accumulator performs regular accumulations.

In some embodiments, the LDPC encoder further comprises a parallel to serial function between the repeater and the interleaver.

In some embodiments, the LDPC encoder is parameterized by a repetition pattern for the repeater, and a permutation for the interleaver.

In some embodiments, the repetition pattern and the permutation are optimized

In some embodiments, the S-random interleaver is a semi-random algorithm with rejection providing s pre-interleaving sequential bits with the post-interleaving distance of not less than s, $$s \le \sqrt{\frac{N}{2}}.$$

In some embodiments, the LDPC code can be represented by a parity check matrix with dual diagonal structure:

$$H_{b2} = [h_b | H'_{b2}] = \begin{bmatrix} h_b(0) & 1 & & & & \\ h_b(1) & 1 & 1 & & 0 & \\ \vdots & & 1 & \ddots & & \\ \vdots & & & \ddots & 1 & \\ \vdots & & 0 & & 1 & 1 \\ h_b(m_b-1) & & & & & 1 \end{bmatrix}$$

In some embodiments, the entire code is representable in matrix form as follows:

$$H = \begin{bmatrix} P_{0,0} & P_{0,1} & P_{0,0} & \cdots & P_{0,n_b-2} & P_{0,n_b-2} \\ P_{1,0} & P_{1,1} & P_{0,0} & \cdots & P_{1,n_b-2} & P_{1,n_b-2} \\ P_{2,0} & P_{2,1} & P_{0,0} & \cdots & P_{2,n_b-2} & P_{2,n_b-2} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

where H is a matrix of size m-by-n, where n is the length of the code and m is the number of parity check bits in the code, where $P_{i,j}$ is one of a set of z-by-z right-shifted identity matrices or a z-by-z zero matrix; the matrix H is expanded from a binary base matrix $H_b$ of size $m_b$-by-$n_b$, where $n=z \cdot n_b$ and $m=z \cdot m_b$, and z is a positive integer, the base matrix is expanded by replacing each 1 in the base matrix with a z-by-z right-shifted identity matrix, and each 0 with a z-by-z zero matrix; partitioning $H_b$ into two sections where $H_{b1}$ corresponds to the systematic bits, and $H_{b2}$ corresponds to the parity-check bits; partitioning section $H_{b2}$ into two sections, where vector $h_b$ has odd weight, and $H_{b2}$ has a dual-diagonal structure with matrix elements at row i, column j equal to 1 for i=j, 1 for i=j+1, and 0 elsewhere:

$$H_{b2} = [h_b | H'_{b2}] = \begin{bmatrix} h_b(0) & 1 & & & & \\ h_b(1) & 1 & 1 & & 0 & \\ \vdots & & 1 & \ddots & & \\ \vdots & & & \ddots & 1 & \\ \vdots & & 0 & & 1 & 1 \\ h_b(m_b-1) & & & & & 1 \end{bmatrix}.$$

where $h_b(0)=1$, $h_b(m-1)=1$, and a third value $h_b(j)$, $0<j<(m_b-1)$ equal to 1.

In some embodiments, the LDPC encoder is further adapted to allow construction for a set of different coding rates based on a common encoder/decoder featuring rate compatible check node processor construction and puncture based rate matching with check node concatenation.

According to another broad aspect, the invention provides an LDPC encoder having a base matrix structure that avoids having multiple weight-1 columns in an expanded matrix.

According to another broad aspect, the invention provides an LDPC encoder implementing an LDPC code that can be represented by a parity check matrix with dual diagonal structure:

$$H_{b2} = [h_b | H'_{b2}]$$

$$= \begin{bmatrix} h_b(0) & 1 & & & & \\ h_b(1) & 1 & 1 & & 0 & \\ \vdots & & 1 & \ddots & & \\ \vdots & & & \ddots & 1 & \\ \vdots & & & 0 & 1 & 1 \\ h_b(m_b-1) & & & & & 1 \end{bmatrix}$$

In some embodiments, the entire code is representable in matrix form as follows;

$$H = \begin{bmatrix} P_{0,0} & P_{0,1} & P_{0,0} & \cdots & P_{0,n_b-2} & P_{0,n_b-2} \\ P_{1,0} & P_{1,1} & P_{0,0} & \cdots & P_{1,n_b-2} & P_{1,n_b-2} \\ P_{2,0} & P_{2,1} & P_{0,0} & \cdots & P_{2,n_b-2} & P_{2,n_b-2} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

according to another broad aspect, the invention provides a method of performing LDPC encoding to determine a parity sequence p given an information sequence s comprising: dividing the information sequence a into $k_b = n_b - m_b$ groups of z bits—let this grouped s be denoted u, $$u = [u(0)\ u(1)\ u(k_b-1)],$$

where each element of u is a column vector as follows $$u(i) = [s_{iz}\ s_{iz+1} \cdots s_{(i-1)z-1}]^T$$

using a model matrix $H_b$, determining the parity sequence p in groups of z—let the grouped parity sequence p by denoted v, $$v = [v(0)\ v(1) \ldots v(m_b-1)],$$

where each element of v is a column vector as follows $$v(i) = [p_{iz}\ p_{iz+1} \cdots p_{(i+1)z-1}]^T$$

performing an initialization step to determine v(0);
performing recursion to determine v(i+1) from v(i), $0 \leq i \leq m_b - 2$.

In some embodiments, an expression for v(0) is derived by summing over the rows of $H_b$ to obtain $$P_{p(x,k_p)}v(0) = \sum_{j=0}^{k_b-1} \sum_{i=0}^{m_b-1} P_{p(i,j)}u(j) \quad (1)$$

where x, $1 \leq x \leq m_b - 2$, is the row index of $h_b$ where the entry is nonnegative and unpaired, and $P_i$ represents the z×z identity matrix circularly right shifted by size i. Equation (1) is solved for v(0) by multiplying by $P_{p(x,k_b)}^{-1}$ and $P_{p(x,k_b)}^{-1} = P_{s-p(x,k_b)}$ since p(x,$k_b$) represents a circular shift.

In some embodiments, the recursion is defined according to:

$$v(1) = \sum_{j=0}^{k_b-1} P_{p(i,j)}u(j) + P_{p(i,k_b)}v(0), \ i = 0, \quad (2)$$

$$v(i+1) = v(i) + \sum_{j=0}^{k_b-1} P_{p(i,j)}u(j) + P_{p(i,k_b)}v(0), \quad (3)$$

$$i = 1, \ldots, m_b - 2$$

where $$P_{-1} \equiv 0_{z \times z}.$$

In some embodiments, an LDPC decoder comprises: a parallel node processing structure, adapted for any selected code rate and interleaver selection, for use in decoding a code implemented in accordance with any one of the methods as summarized above.

BRIEF DESCRIPTION OF THE DRAWINGS

FIG. 6 is a schematic of a check node computation;
FIG. 7 is a schematic of a complete group of events;
FIG. 8 is a plot of function ln((exp(x)−1)/(exp(x)+1))

DETAILED DESCRIPTION OF THE PREFERRED EMBODIMENTS

Figure 1:
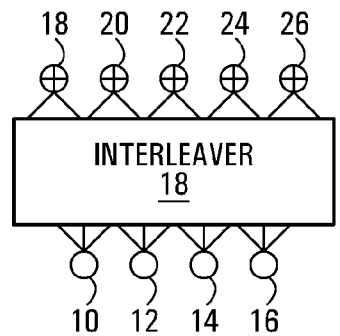
FIG. 1 is a schematic of an RA codes structure.

FIG. 1 shows an example of a systematic RA code structure where the coding complexity grows linearly with the code block length. The illustrated example takes four systematic bits and produces five check bits. The four systematic bit inputs are indicated at 10, 12, 14, 16. Multiple copies of each systematic bit are input to an interleaver 18. Selected outputs of the interleaver are fed to the five check nodes 18, 20, 22, 24, 26 that produce the parity bits. The LDPC message-passing algorithm is applicable to the structure of this code. In other words this code allows decoding by the Tanner graph. The obtained performance practically is not worse than other codes of the LDPC class.

Figure 2:
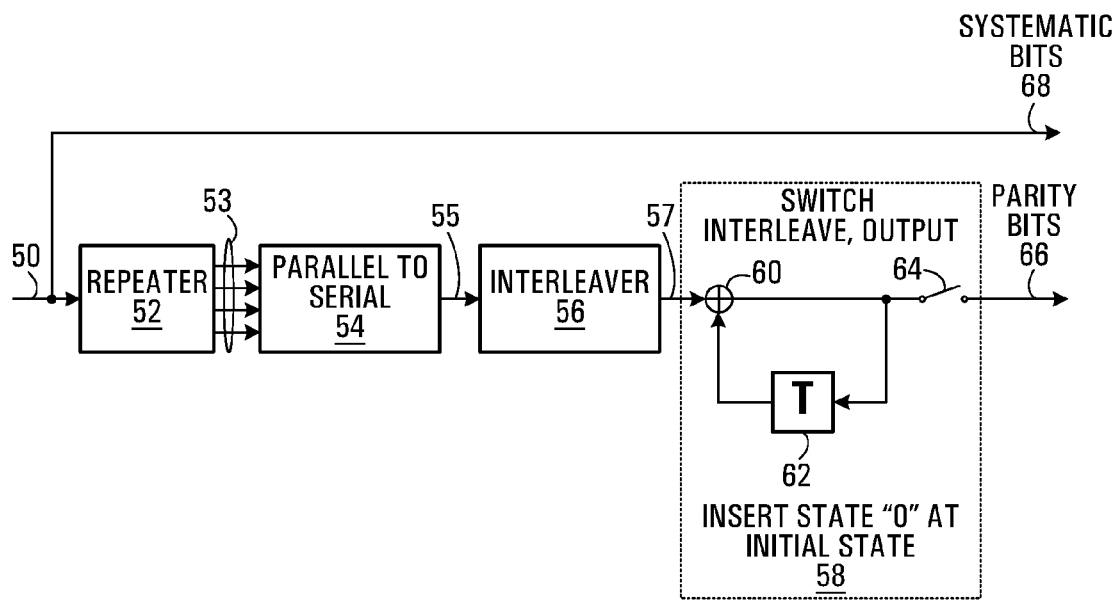
FIG. 2 is a schematic of an RA encoder structure.

An encoder provided by an embodiments of the invention is shown in block diagram form in FIG. 2. The encoder has an input 50 for receiving systematic bits to be encoded. The encoder outputs consist of systematic bits 68 and parity bits 66. The systematic bit input 50 is input to a repeater 52 that produces a parallel output 53 fed to a parallel to serial converter 54. The serial output 55 is input to an interleaver 56. The interleaver output 57 is input to an accumulator. In the illustrate example, the accumulator comprises an XOR function 60 and state element 62, but other designs are possible. The output of the XOR function 60 is fed back through a state element 62 to a second input of the XOR function 60. From time to time, preferably with irregular accumulation periods, a bit at the output of the accumulator 58 (of XOR function 60 in the illustrated example) is taken as one of the parity bits 66. This is illustrated schematically with switch 64. The times at which a parity bit is taken at the output of XOR function 60 is a function of the encoder structure.

In order to increase error correcting ability, preferably the irregular repetition of systematic symbols, as well as irregular summing after the interleaver can also be used. Hence, the three following tables can be used to set the code within the structure of FIG. 2:

1. Table of the systematic part repetition;
2. Interleaver;
3. Table of summing after interleaving.

An example of a table containing both the systematic part repetition and summing information is shown below. The repetition table column identifies how the repeater output is generated from the systematic bit input. In the illustrated example, there is an eight bit systematic input. The repetition column indicates how many times in addition to once the bit is repeated, and the summing table column indicates how many bits are summed of the interleaver output to produce each parity bit output. The summing table would control the production of parity bits 66 at the output XOR function 60 of the example of FIG. 2. In the illustrated example, there is a total of five parity bits produced for each eight systematic bits.

We have 8 bits systematic bit, we use the left column repeat cyclically for 8 bits to expand to:

1 1 2 2 2 3 3 3=17 bits

These bits are interleaved and then the right column summation table is used to sum to produce parity bits:

3→1 4→1 5→1 3→1 2→1 we have total 5 parity bits

The coding rate for this example is 8/(8+5)=8/13

TABLE 1

Encoding table (an example)

| Repetition table | Summing table |
|---|---|
| 0 | 3 |
| 0 | 4 |
| 1 | 5 |
| 1 | 3 |
| 1 | 2 |
| 2 | |
| 2 | |
| 2 | |

As seen from the above table, the first bit and second bit are included once, the third, fourth and fifth bits are included twice, and the sixth, seventh and eighth bits are included three times. As seen from the above table, in order to obtain the first check bit, the XOR operation must be performed with 3 bits sequentially at the interleaver output. The next check bit is obtained by the XOR operation with the next 4 bits of the interleaver output and the first check bit, and so on using the number of such bits is specified in the table. The use of a table to indicate how many times each systematic bit is repeated is simply one example of a structure that can be used to achieve this function. The number of repetitions of each bit of course will be a function of the particular code design as will the number of systematic bits that are being used, i.e., the block size. Similarly, the number of parity bits generated will be a function of the particular code design and the number of interleaver output bits used to generate a respective parity bit is a code-specific parameter. The examples given in the encoding table of Table 1 are only a very specific example.

Figure 9:
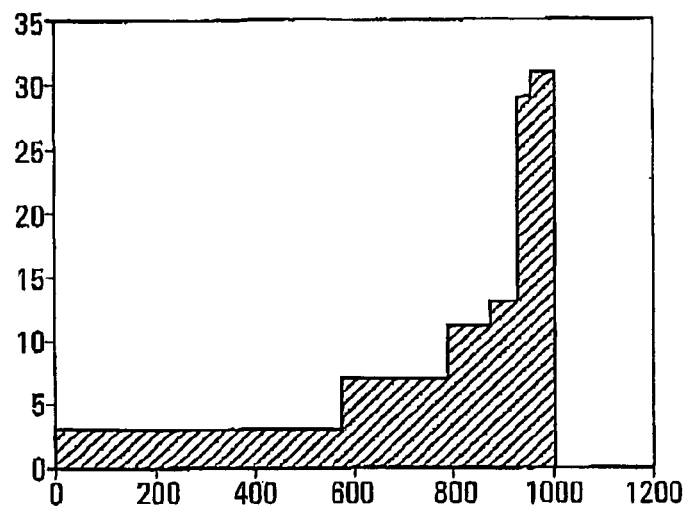
FIG. 9 is a plot of Irregular variable node repetition table.

In an example the irregular repetition factor is shown in FIG. 9 and the summation factor is listed in Table 4 based on different code rates.

In a preferred embodiment, the interleaver is an "s-random" interleaver. The selected algorithm is a semi-random algorithm with rejection providing s pre-interleaving sequential bits with the post-interleaving distance of not less than s. As demonstrated, such an interleaving process converges if $$s \le \sqrt{\frac{N}{2}}.$$

Such an approach to interleaving allows the exclusion of short cycles in the obtained matrix.

Direct Encoding

In general, each of the LDPC codes is a systematic linear block code. Each LDPC code in the set of LDPC codes is defined by a matrix H of size m-by-n, where n is the length of the code and m is the number of parity check bits in the code. The number of systematic bits is k=n−m.

The matrix H is defined as an expansion of a base matrix and can be represented by $$H = \begin{bmatrix} P_{0,0} & P_{0,1} & P_{0,0} & \cdots & P_{0,n_b-2} & P_{0,n_b-2} \\ P_{1,0} & P_{1,1} & P_{0,0} & \cdots & P_{1,n_b-2} & P_{1,n_b-2} \\ P_{2,0} & P_{2,1} & P_{0,0} & \cdots & P_{2,n_b-2} & P_{2,n_b-2} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

where $P_{i,j}$ is one of a set of z-by-z right-shifted identity matrices or a z-by-z zero matrix. The matrix N is expanded from a binary base matrix Eb of size $m_b$-by-$n_b$, where $n = z \cdot n_b$, and $m = z \cdot m_b$, and z is a positive integer. The base matrix is expanded by replacing each 1 in the base matrix with a z-by-z right-shifted identity matrix, and each 0 with a z-by-z zero matrix. Therefore the design accommodates various packet sizes by varying the submatrix size z.

It is known that such an $H_b$ can be partitioned into two sections where $H_{b1}$ corresponds to the systematic bits, and $H_{b2}$ corresponds to the parity-check bits.

According to an aspect of the invention, section $H_{b2}$ is further partitioned into two sections, where vector $h_b$ has odd weight, and $H_{b2}$ has a dual-diagonal structure with matrix elements at row i, column j equal to 1 for in i=j, 1 for i=j+1, and 0 elsewhere:

$$H_{b2} = [h_b | H'_{b2}]$$

$$= \begin{bmatrix} h_b(0) & \begin{vmatrix} 1 & & & & \\ 1 & 1 & & 0 & \\ & 1 & \ddots & & \\ & & \ddots & 1 & \\ & 0 & & 1 & 1 \\ & & & & 1 \end{vmatrix} \\ h_b(1) \\ \vdots \\ \vdots \\ \vdots \\ h_b(m_b-1) \end{bmatrix}.$$

The base matrix has $h_b(0)=1$, $h_b(m-1)=1$, and a third value $h_b(j)$, $0<j<(m_b-1)$ equal to 1. The base matrix structure avoids having multiple weight-1 columns in the expanded matrix, this can be realized by optimization of the interleavers.

In particular, the non-zero submatrices are circularly right shifted by a particular circular shift value. Each 1 in $H'_{b2}$ is assigned a shift size of 0, and is replaced by a z×z identity matrix when expanding to H. This allows the realization of the dual diagonal structure with simple recursive circuitry. The two 1s located at the top and the bottom of $h_b$ are assigned equal shift sizes, and the third 1 in the middle of $h_b$ is given an unpaired shift size. The unpaired shift size is 0.

Encoding is the process of determining the parity sequence p given an information sequence s. To encode, the information block s is divided into $k_b = n_b - m_b$ groups of z bits. Let this grouped s be denoted u, $$u = [u(0)\ u(1) \ldots u(k_b-1)],$$

where each element of u is a column vector as follows $$u(i) = [s_{iz}\ s_{iz+1} \ldots s_{(i+1)z-1}]^T$$

Using the model matrix $H_b$, the parity sequence p is determined in groups of z. Let the grouped parity sequence p by denoted v, $$v = [v(0)\ v(1) \ldots v(m_b-1)],$$

where each element of v is a column vector as follows $$v(i) = [p_{iz}\ p_{iz+1} \ldots p_{(i+1)z-1}]^T$$

Encoding proceeds in two steps, (a) initialization, which determines v(0), and (b) recursion, which determines v(i+1) from v(i), $0 \leq i \leq m_b-2$.

An expression for v(0) can be derived by summing over the rows of $H_b$ to obtain $$P_{p(x,k_p)}v(0) = \sum_{j=0}^{k_b-1} \sum_{i=0}^{m_b-1} P_{p(i,j)} u(j) \quad (1)$$

where x, $1 \leq x \leq m_b-2$, is the row index of $h_b$ where the entry is nonnegative and unpaired, and $P_i$ represents the z×z identity matrix circularly right shifted by size i. Equation (1) is solved for v(0) by multiplying by $P_{p(x,k_b)}^{-1}$, and $P_{p(x,k_b)}^{-1} = P_{s-p(x,k_b)}$ since p(x,$k_b$) represents a circular shift.

Considering the structure of $H'_{b2}$, the recursion can be derived as follows, $$v(1) = \sum_{j=0}^{k_b-1} P_{p(i,j)} u(j) + P_{p(i,k_b)} v(0),\ i = 0, \quad (2)$$

$$v(i+1) = v(i) + \sum_{j=0}^{k_b-1} P_{p(i,j)} u(j) + P_{p(i,k_b)} v(0), \quad (3)$$

$$i = 1, \ldots, m_b - 2$$

where $$P_{-1} \equiv 0_{z \times z}.$$

Thus all parity bits not in v(0) are determined by evaluating Equation (2) for $0 \leq i \leq m_b-2$.

Equations (1) and (2) completely describe the encoding algorithm. These equations also have a straightforward interpretation in terms of standard digital logic architectures. In particular, they are easily implemented suing the encoding architecture described with reference to FIG. 2 above.

Basic Decoder Structure

The following modifications of decoding algorithm are possible:
1. Min-sum algorithm (analog of Max-Log MAP)
2. Sum-product (analog of Log-MAP)
  a. Sum-product in E-presentation
  b. Probability decoding (tan h( ) rule).

With the well known graph-decoding concept, the decoding is performed iteratively, i.e., the purpose of the iteration is providing the a priory information to the next iteration. Hence, the search for the nearest valid code word is performed by a sequential approximation method. It has been shown that the result in this is close to maximum likelihood decision.

Figure 3:
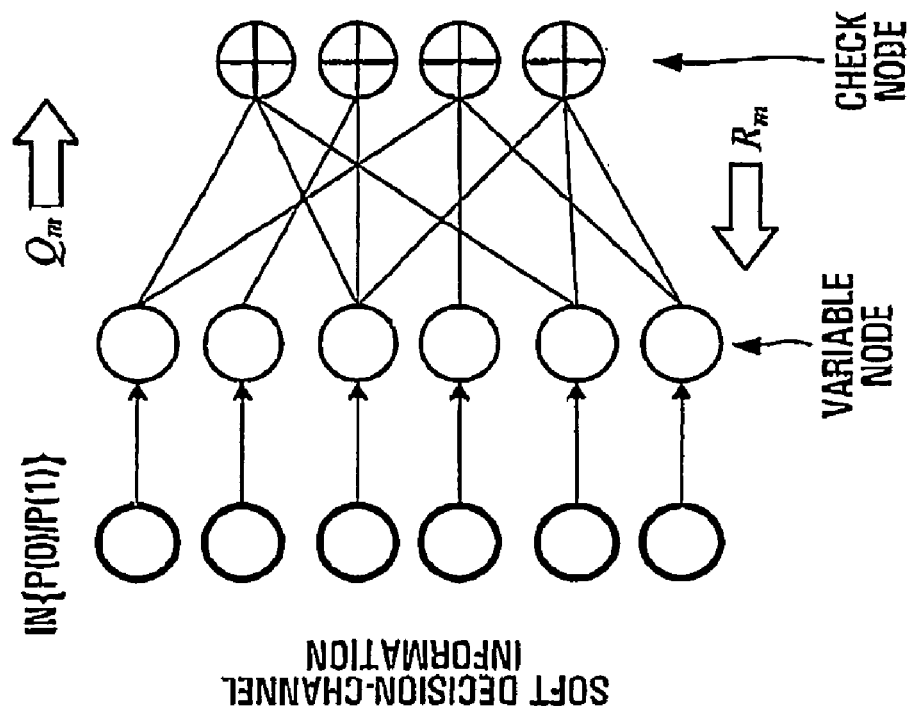
FIG. 3 is a schematic of a decoding algorithm.

An example of a message-passing algorithm block diagram is shown in FIG. 3. Each graph edge matches two numbers referred to as messages: the message from the variable node to the check node, and the message from the check node to the variable node. Each message is a number like a soft decision. Before the start of decoding they are initialized to zero. The size of the message arrays is equal to the size of the internal interleaver of the decoder and interleaver used to permute them.

Figure 4:
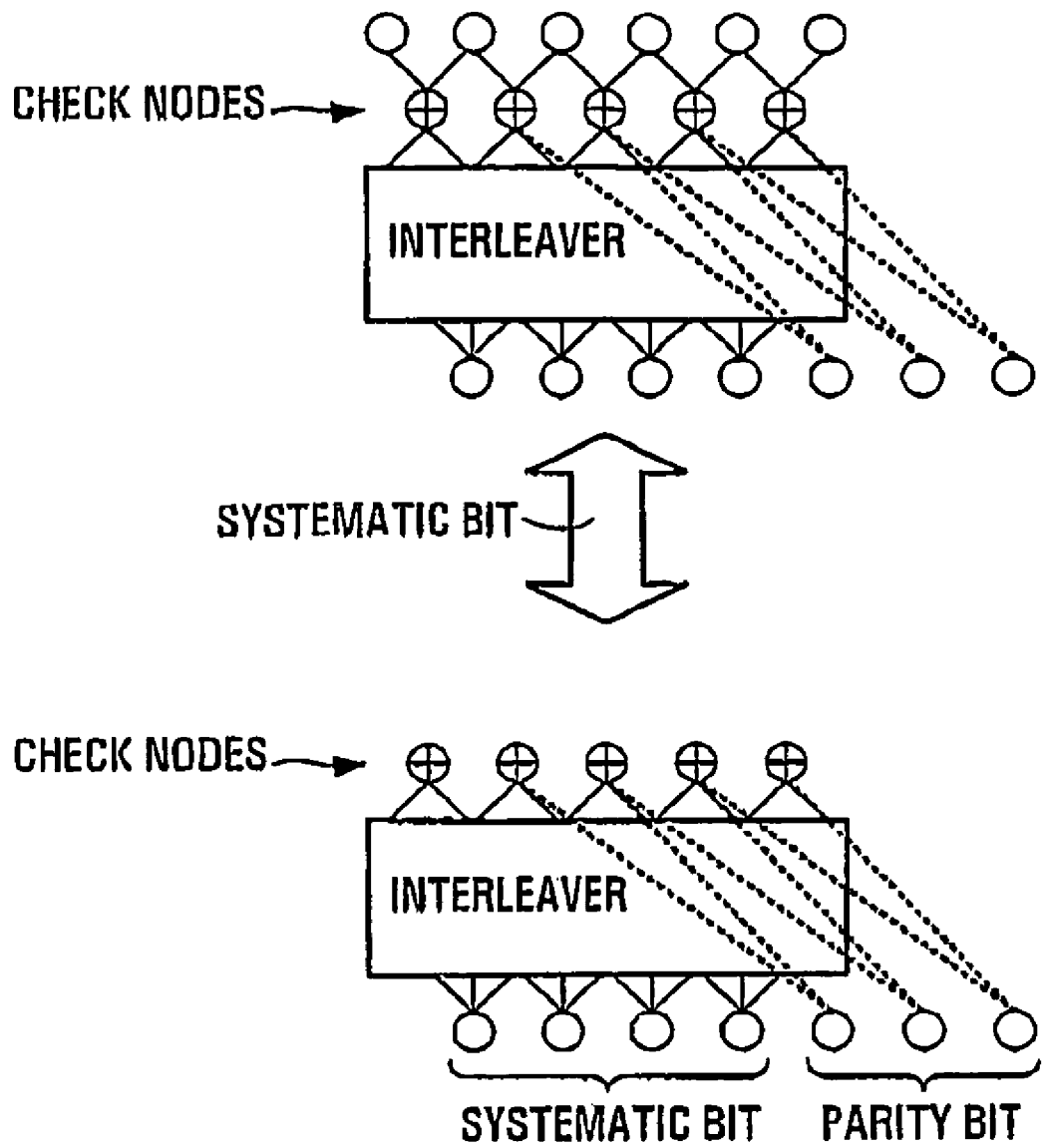
FIG. 4 is a schematic of a modified interleaver of the decoder.

For the RA codes the internal interleaver of the decoder is differentiated from the internal interleaver of the encoder by the parity bits being included into the interleaving process. See FIG. 4.

The tables of repetition and summing are changed according to the interleaver. The systematic nodes and parity nodes are not differentiated while decoding, but are both considered as variable nodes.

The operations calculating outgoing messages from the variable node to the check node include summing of all messages received by the variable node from other check nodes, except the one supposed to receive the message, plus a soft decision received from the demodulator. See FIG. 5.

During calculation of the outgoing message from the check node to the variable node the incoming message from the variable node, for which the outgoing message is calculated, is neglected.

The operation of message calculation from the check node to the variable node has two parts:
Definition of the message sign, and
Definition of the message module.

The message sign is defined by zero equality condition of the check sum. Hence, the sub of incoming messages from the variable nodes is calculated, and the obtained sign is assigned to the outgoing message.

A Simple Way to Calculate the Outgoing Message from the Check Node (Min-Sum).

Figure 5:
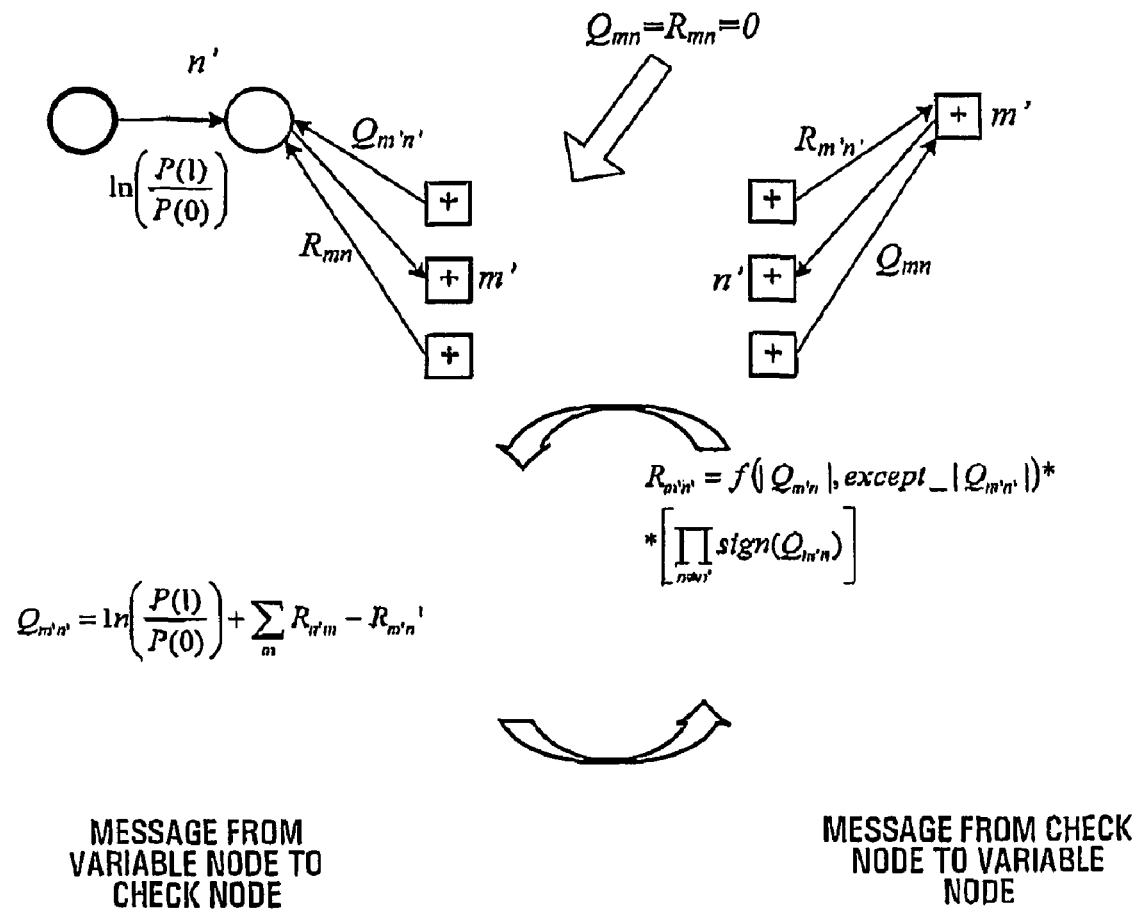
FIG. 5 is a schematic of a message calculation.

The outgoing message module is calculated by the function of FIG. 5. This function is the decision function or the Log-likelihood ratio. The function f has the commutative feature:

$$f(a,b,c,d)=f(a,f(b,f(c,f(d))))$$

$$f(d)=d$$

There are several methods of setting the function f.
1. The simplest method is known as the min-sum algorithm. The absolute value of outgoing message is equal to the minimum module of the considered incoming messages:

$$f(|Q_{m'n}|, \text{except\_}|Q_{m'n'}|) = \min_{m'n'}(|Q_{m'n}|)$$

1. Another method is similar to the function E calculation in the LOG MAP algorithm. The function f is given by:

$$f(a,b)=\min(a,b)+\delta,$$

$$\delta = \log(1-\exp(-|a+b|)) - \log(1-\exp(-|a-b|))$$

The function $E(x)=\log(1-\exp(-|x|))$, widely used in the turbo coding, can be set as a table.
1. There is a modification of method 2, where;

$$\delta = \begin{cases} 1, & |a-b| \le 1, |a+b| > 1 \\ -1, & |a-b| > 1, |a+b| \le 1 \\ 0, & \text{else} \end{cases}$$

Method does not require the function E table. However, this method leads to the performance degradation.

The number of operations of method 2 can be reduced due to the message calculation from the check node with the immediate sign consideration. The technique allowing that is described below.

Log-Likelihood Ratio Logarithm Calculation at the Check Node in E-Presentation.

Taking the commutative feature of the function f into consideration, let us consider the elementary "box-sum" operation or calculation of the log-likelihood ratio.

$$\lambda = \ln\left(\frac{p_{x=1}}{p_{x=n}}\right) = \ln\left(\frac{p}{1-p}\right) = \frac{2x}{\sigma^2}, \quad (1)$$

$$p_{x=1} = p$$

$$p_{x=n} = 1 = p$$

where p—a posteriori probability of transmission of 1, on the condition that the received signal is equal to x, the signal is BPSK; +1, −1; and the noise is AWGN with dispersion $\sigma^2$.

Respectively, λ—the decision function or the log-likelihood ratio logarithm.

$$e^\lambda = \frac{p}{1-p}, (1-p)e^\lambda = p, \quad (2)$$

$$p = \frac{\sigma^\lambda}{1+\sigma^\lambda},$$

$$1-p = \frac{1}{e^\lambda + 1}$$

Statement of problem: What is a posteriori probability $p_3$ (the log-likelihood ratio logarithm $\lambda_3$) of FIG. 6, if a posteriori probabilities $p_1$ and $p_2$ are known (the log-likelihood ratio logarithms $\lambda_1, \lambda_3$)? The operation performed at the coder check node is the modulo 2 addition.

The complete group of events is built in order to solve the above stated problem as shown in FIG. 7. Then, $$\lambda_3 = \ln\left(\frac{p_1(1-p_2) + p_2(1-p_1)}{p_1 p_2 + (1-p_1)(1-p_2)}\right) \quad (3)$$

$$\lambda_3 = \ln\left(\frac{\frac{e^{\lambda_1}}{(e^{\lambda_1}+1)}\frac{1}{(e^{\lambda_2}+1)} + \frac{e^{\lambda_1}}{(e^{\lambda_3}+1)}\frac{1}{(e^{\lambda_1}+1)}}{\frac{e^{\lambda_1}}{(e^{\lambda_1}+1)}\frac{e^{\lambda_2}}{(e^{\lambda_2}+1)} + \frac{1}{(e^{\lambda_1}+1)}\frac{1}{(e^{\lambda_2}+1)}}\right) \text{ or} \quad (4)$$

$$\lambda_3 = \ln\left(\frac{e^{\lambda_1} + e^{\lambda_2}}{e^{\lambda_1+\lambda_2}+1}\right) \quad (5)$$

on the condition that $e^{\lambda_1}+1 \ne 0$, $e^{\lambda_2}+1 \ne 0$ $$\lambda_2 = \ln(e^{\lambda_1}+e^{\lambda_2}) - \ln(e^{\lambda_1+\lambda_2}+1) = E(\lambda_1,\lambda_2) - E(0,\lambda_1+\lambda_2) \quad (6)$$

where the turbo code function E is widely used $$E(a,b) = \ln(e^a + e^b) = \max(a,b) + \ln(1+e^{-|a-b|}) \quad (7)$$

Hence, the message with a correct sign can be calculated at once. In addition to two calls of the function E, only one addition and one subtraction are performed.

Another Way to Compute Log-Likelihood Ratio (Probability Decoding—tan h( ) Rule).

It is shown in (3) the probability $p_3$ can be represented by $$p_3 = p_1(1-p_2) + p_2(1-p_1) = p_1 + p_2 - 2p_1p_2 \quad (8)$$

Multiplying both parts by 2 and subtracting 1, we obtain:

$$2p_3 - 1 = 2p_1 + 2p_2 - 4p_1p_2 - 1 \quad (9)$$

Decomposing the right part into the multipliers:

$$(2p_1-1)(2p_2-1) = 4p_1p_2 - 2p_1 - 2p_2 1 \quad (10)$$

Substituting the dissipation result, we obtain:

$$(2p_3-1) = -(2p_1-1)(2p_2-1) \quad (11)$$

or, with the logarithms except the case of $2p_1-1=0$:

$$[\ln(2p_3-1)] = -[\ln(2p_1-1)] - [\ln(2p_2-1)], p_1 \neq 0.5 \quad (12)$$

where the logarithms is expressed by $\lambda$ as follows:

$$\ln(2p-1) = \ln\left(\frac{2e^\lambda}{1+e^\lambda} - 1\right) = \ln\left(\frac{e^\lambda - 1}{e^\lambda + 1}\right) \quad (13)$$

Let us consider the properties of the function $$f(\lambda) = \ln\left(\frac{e^\lambda - 1}{e^\lambda + 1}\right).$$

Figure 10:
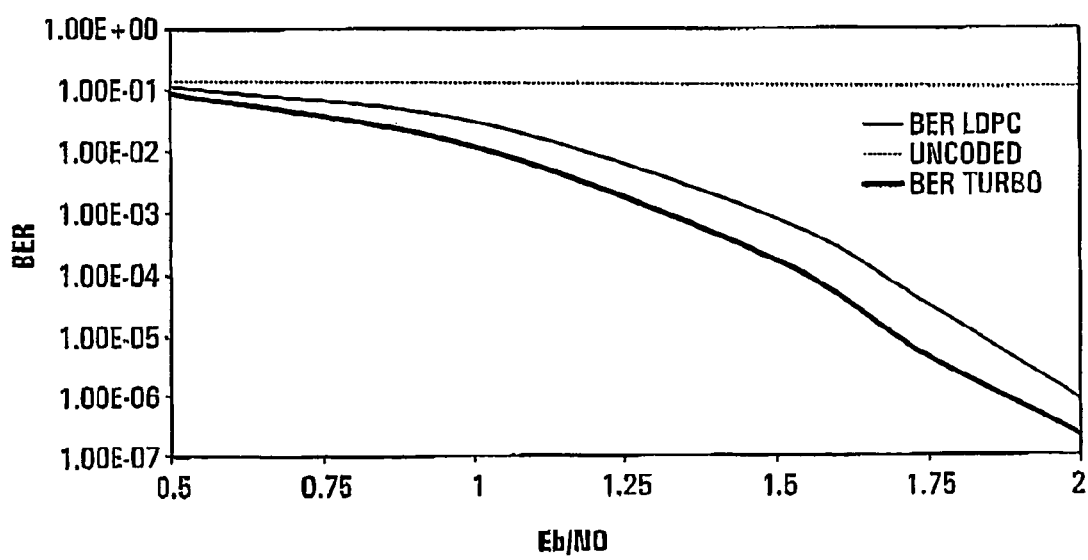
FIG. 10 is a plot of BER vs Eb/NO.

The function has following properties:

1. even function $f(\lambda) = f(-\lambda)$
2. the function is plotted in FIG. 10
3. the function is not defined at the 0 the function is a self-inverse function $f(f(x))=x$

The operation sequence of computations at the check node is given below.
  1. The outgoing message sign is calculated in a standard manner by XORing the signs of incoming messages except this one, if there was no zero among the incoming messages, otherwise the outgoing message is also zero;
  2. For all incoming messages a direct conversion by the table $f(x) = -\ln((\exp(x)-1)/(\exp(x)+1))$ is made, where x—incoming message (plotted in FIG. 8;
  3. The sum of converted messages is calculated according to (12).
  4. The function-reverse f conversion is calculated for the obtained sum.

SUMMARY

Two algorithms of check node operating are provided: "E-presentation" and "tan h( ) rule". Both have no losses and give ML decision. Consideration of these methods will be continued in H/W architecture design section. The next section will provide comparison with turbo-code at simulator with B-presentation.

Stimulation and Turbo-Code Comparison

The first simulation aim is to perform comparison at the fixed rate ½. Then the rate compatible LDPC code based repeat-accumulative encoder structure has been introduced. The next simulation aim is to compare with punctured 3GPP2 turbo-decoder specified below in Table 4.

Input Signal Quantization

If the E function table is used, the input signal must be converted to the unit dispersion and represented as $$\frac{2x}{\sigma^2} \text{ or } \frac{r_1^2 - r_0^2}{\sigma^2},$$

where $r_1$ and $r_2$—the distance to the respective constellation points. Then 8-bit quantization is performed with the step of $$\Delta = \frac{\sigma^2}{32}.$$

The E function table is initialized with the same step.

Code Parameters and Simulation Results

The comparison is performed at the rate ½, the information block size is 1000 bits. Fox the LDPC IRA code an irregular repetition table is selected (FIG. 9). The size of the internal interleaver in this case is 7000. This is an s-random interleaver with s=32. After interleaving a regular combining is performed at the check node with an interval equal to 7 for rate ½.

For the purpose of comparison, the 3GPP2 turbo code is selected.

Figure 12:
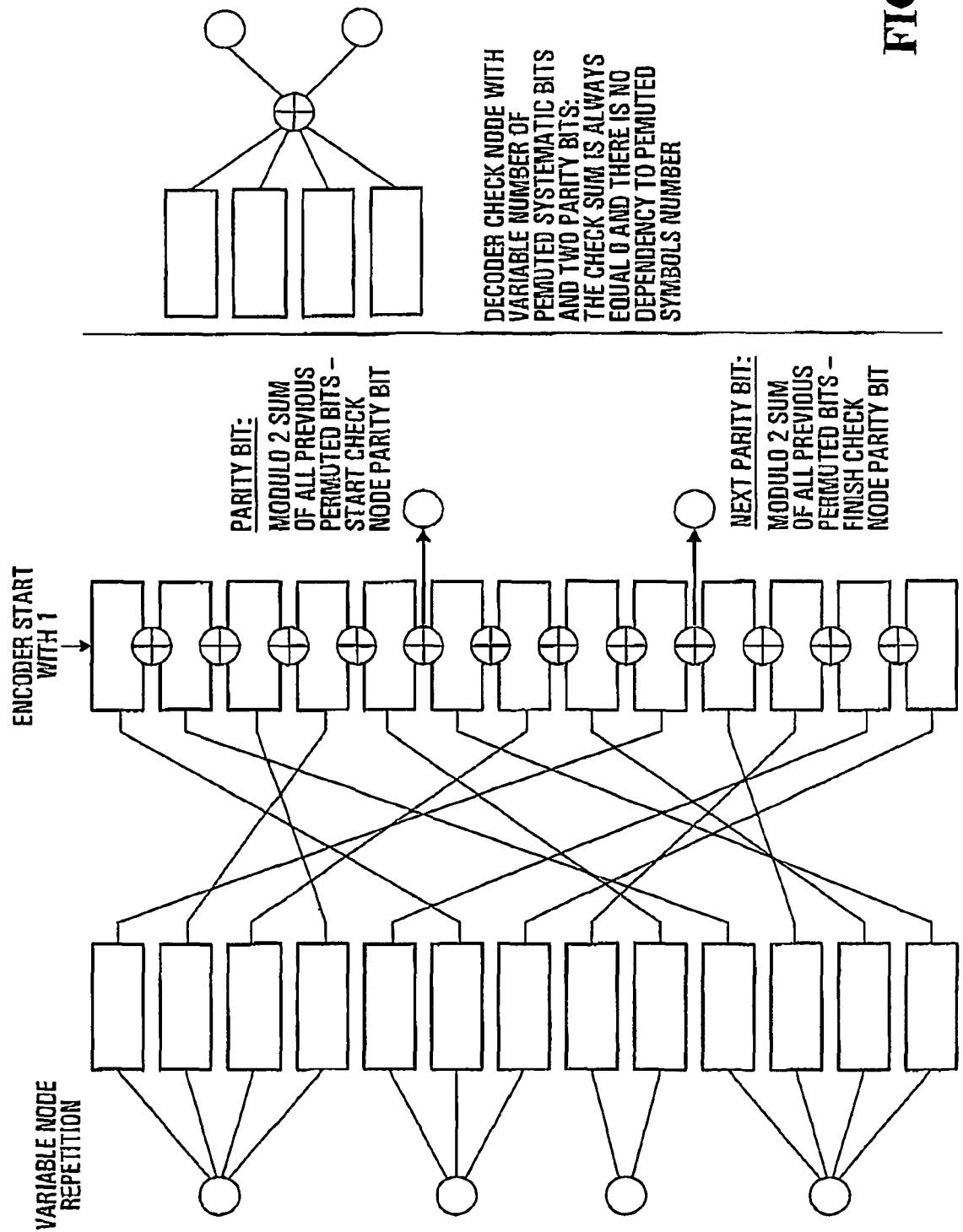
FIG. 12 is a schematic of a variable rate decoder structure.

The rate compatible LDPC decoder based RA encoder structure is obtained by concatenation check nodes demuxed by puncturing parity symbols. The parity sum at concatenated check node has mandatory equal zero if component nodes has zero check sum. The FIG. 12 illustrates the derivation of all possible rates from RA encoder by changing the size of check nodes. The RA encoder structure guarantees that parity check sum is equal to zero.

Figure 13:
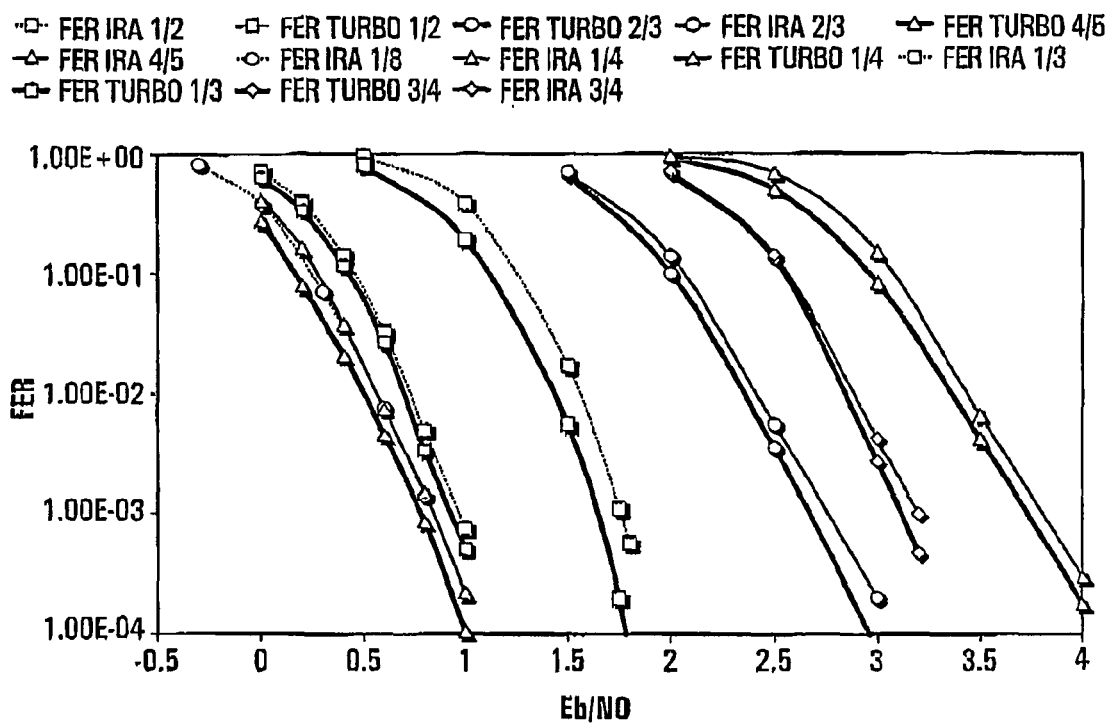
FIG. 13 is a plot of number of systematic messages at check node.
Figure 14:
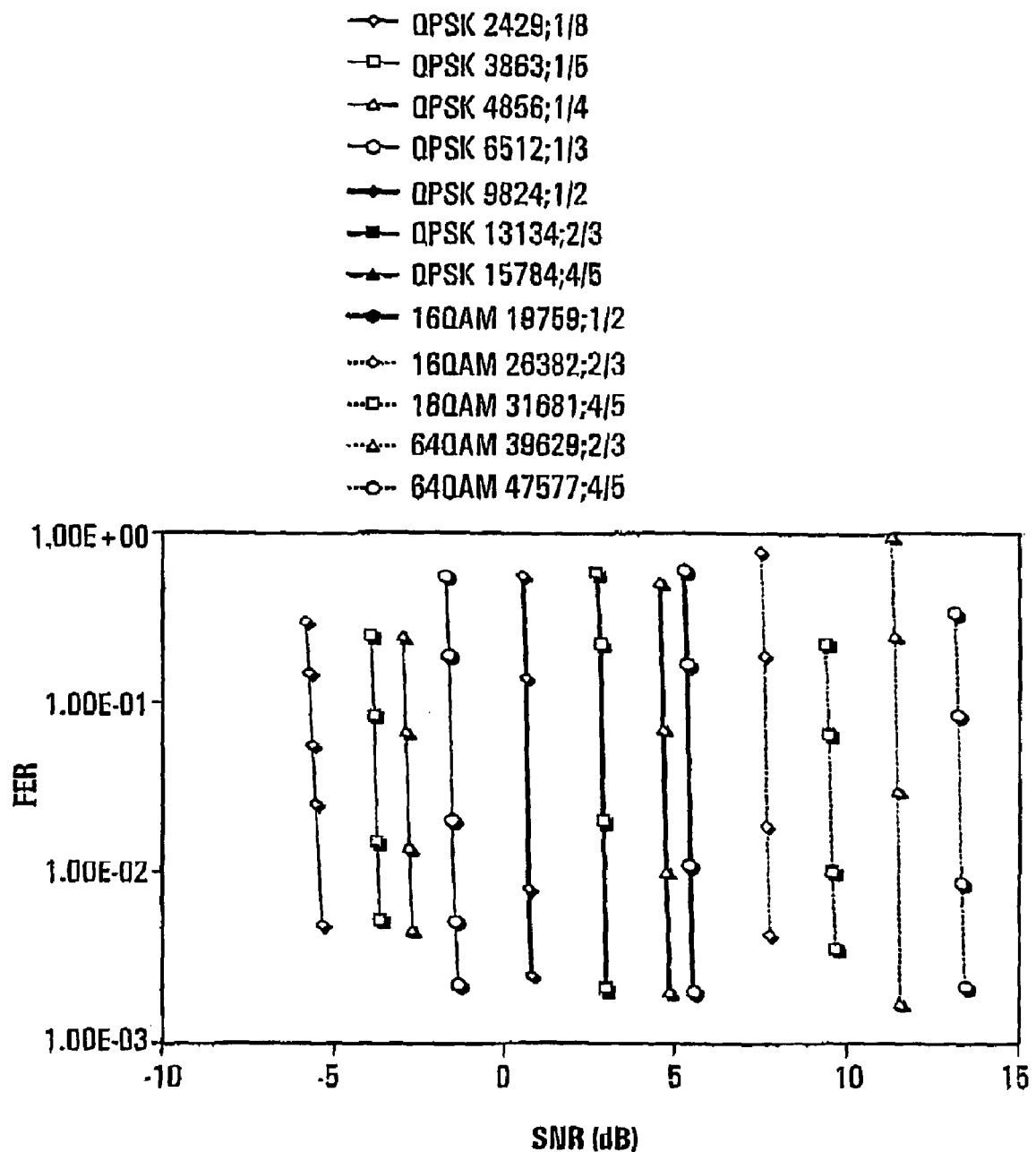
FIG. 14 is a plot of "frame error rate for variable rate decoders: IRA-7 & 3GPP2 turbo, frame size 1000 bit"

At the encoder side the rate compatible code generated by changing the period of locking the key "Parity Symbol End". At the decoder side the number of the permuted messages to the check node corresponds to the parity symbol generating period. The simulation results and 3GPP2 turbo decoder comparison are given at the FIG. 13.

TABLE 2

Number of systematic messages at check node

| Rate | Parity symbol generating period - variable number of the permuted messages from systematic nodes to each check node |
|---|---|
| ½ | 7 |
| ⅓ | 3-4 |
| ¼ | 2-2-3 |
| ¾ | 14 |
| ⅘ | 28 |
| ⅛ | 1 |

The above Table has been selected for the repetition factor $\alpha=7$, and an optimized irregular structure of the repetition table is shown in FIG. 9, demonstrating the number of repetitions as a function of the bit number in transmission.

The rate compatible LDPC IRA codes has no losses than turbo codes except for very low rate ¼ and very high rate (⅘). The repetition table is optimized in order to obtain the best performance at the main rates (½, ⅓, ⅔, ¾). In this case the rate ⅛ is worse than the rate ¼, i.e., the data should be repeated twice at the rate ¼, rather than coded at the rate ⅛. In addition, error floor for the IRA code is much lower in comparison to the turbo-code.

The average repetition factor of 7 is selected based on the maximum code rate ⅛.

Also it should be noted that the described code is a rate compatible code, i.e., it forms the variable rate code family, allowing the HARQ-II implementation.

The following table is rate set and the simulation result with dual—maxima demodulator from SNR for modulation symbol is presented.

TABLE 3

Rate Set

| MCS Index | CodeRate | QAM | Payload (bits/TTI (2 ms)) | UserRate(Mbits/s) |
|---|---|---|---|---|
| 1 | 0.125 | 2 | 2428 | 1.21 |
| 2 | 0.200 | 2 | 3863 | 1.93 |
| 3 | 0.250 | 2 | 4856 | 2.43 |
| 4 | 0.333 | 2 | 6512 | 3.26 |
| 5 | 0.500 | 2 | 9824 | 4.91 |
| 6 | 0.667 | 2 | 13135 | 6.57 |
| 7 | 0.800 | 2 | 15785 | 7.89 |
| 8 | 0.500 | 4 | 19759 | 9.88 |
| 9 | 0.667 | 4 | 26382 | 13.19 |
| 10 | 0.800 | 4 | 31681 | 15.84 |
| 11 | 0.667 | 6 | 39629 | 19.81 |
| 12 | 0.750 | 6 | 44596 | 22.30 |
| 13 | 0.800 | 6 | 47577 | 23.79 |

IRA-7 Codes Performance Conclusion

There are BER, FER curves from modulation symbol energy to noise ratio. All MCS from Table 4 are presented. The remaining problem is that code matrix for each rate is different. The code that is developed in this project according to the aims of the project is rate compatible (⅛-⅘). It means that the high rates are obtained by puncturing mother code. The systematic part of the code must be the same and stable. However, the obtained results give good benchmarks for code comparison.

H/W Architecture Design and Complexity Analysis

Basic LDPC Decoder Architecture.

Figure 15:
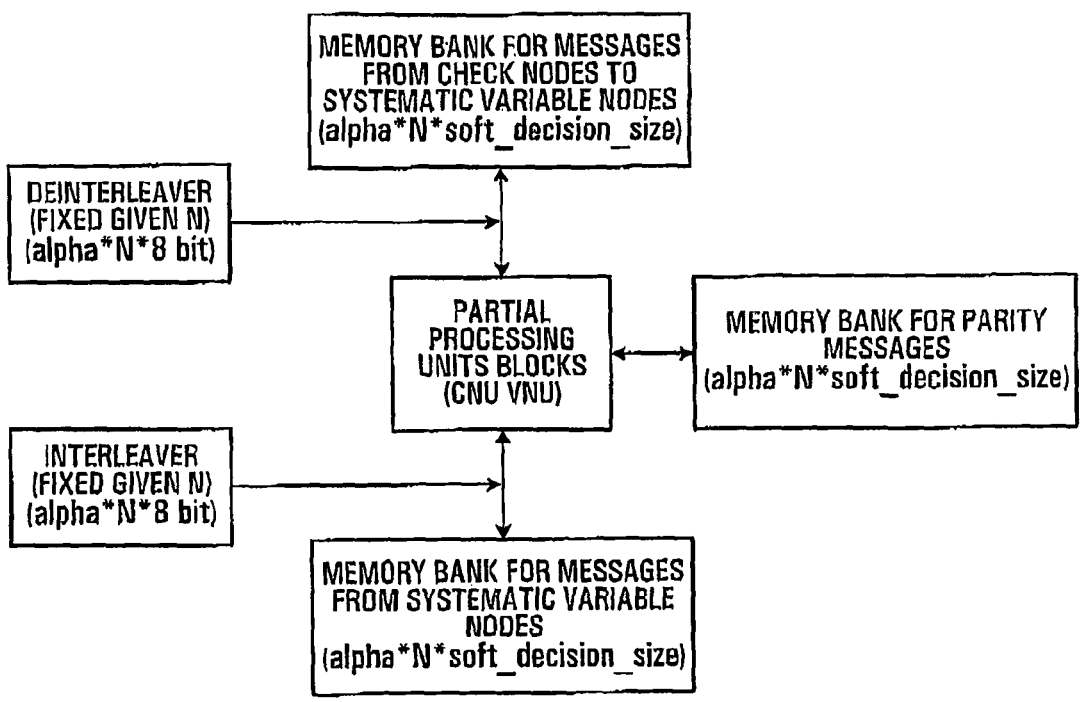
FIG. 15 is a schematic of a basic IRA decoder structures.

An example decoder structure is shown in FIG. 15.

The main implementation problem of such architecture is the FPGA limitations of the RAM access. In particular, Virtex 812EM implements dual-port access to the 4k memory blocks. That is, within one clock either two numbers can be read from such block, or one number can be read and another one can be written. Hence, the implementation of parallel message processing requires arrangement of messages from the variable node in the accessible memory banks, in order to read the messages, processed by the check node processor, from different memory banks, and written to different memory banks in order to avoid access conflicts.

Figure 16:
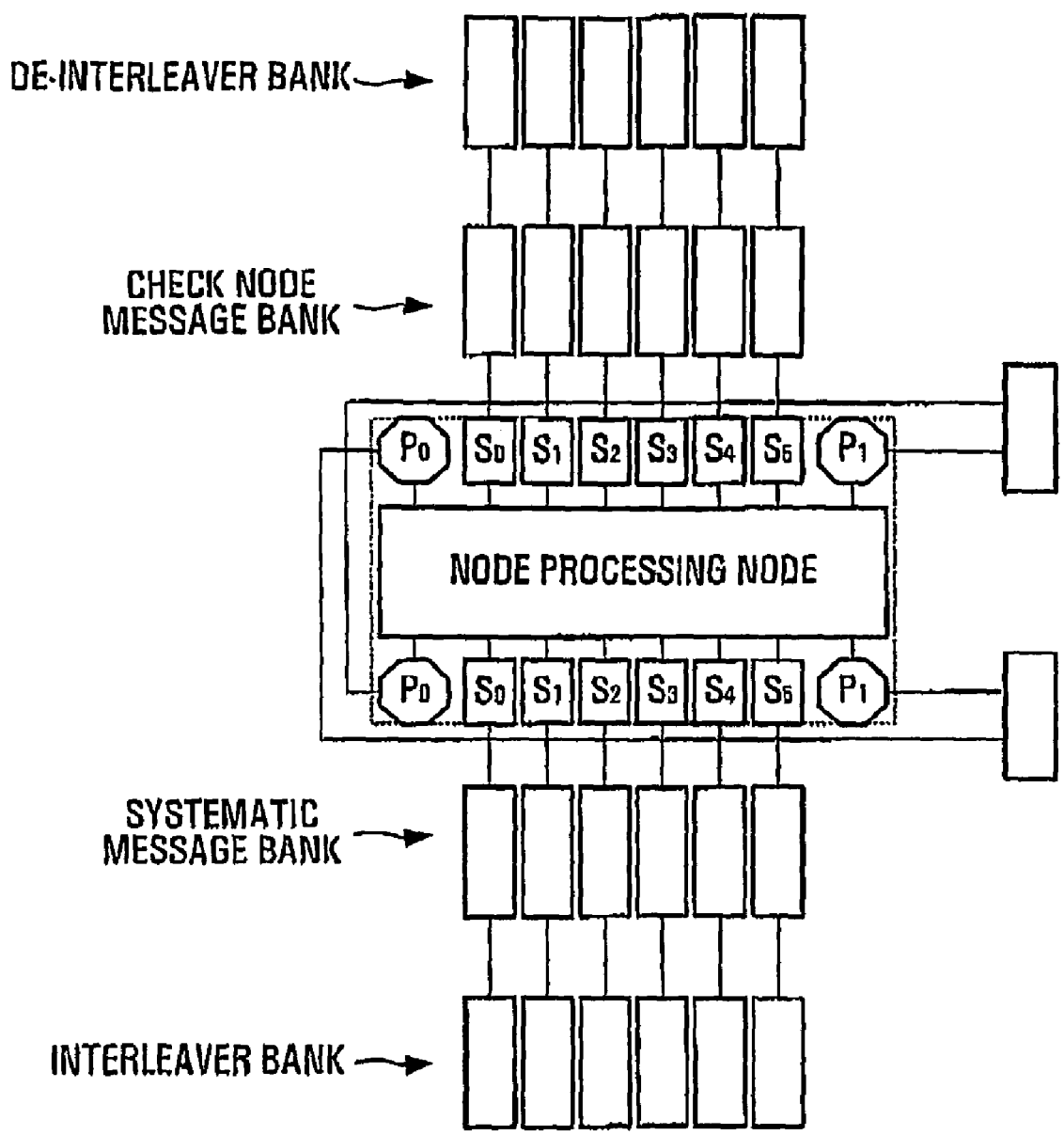
FIG. 16 is a schematic of a parallel Node Processing.

The structure of parallel check node processor is shown in FIG. 16 based on "decoder-first code design" rule. Let us consider the operation speed estimation of the decoder:

$$T = \frac{F_d * Z * R}{\alpha * I} \quad (14)$$

where Fd—FPGA clock rate, Z—parallel factor of computation, R—coding rate, α—code symbol repetition factor (in average), I—number of iterations.

Z is equal to number of parallel computing messages. The number of corresponding data bits which processing at one FPGA clock is compute and divide at iteration number to obtain throughput and decoder operation speed. The following formula is applied to parallel LDPC decoder to compute its operation speed, Interleaver Design There are two approaches to interleaver design.

Algebraic

Random

The performance losses for Algebraic interleaver for rates R>½ (means ⅔, ¾, ⅘) is observed. It is not applicable for rate compatible decoder with rate in the range of ⅛-⅘.

Random interleaver with RA encoder structure is in focus or the present work.

Figure 17:
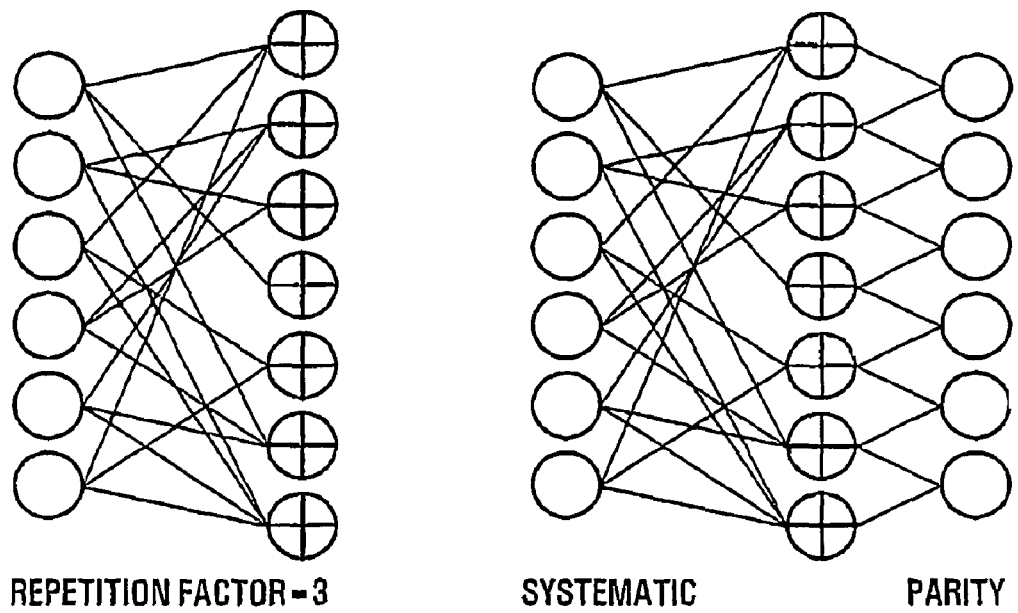
FIG. 17 is a schematic of a repetition factor in interleaver.
Figure 18:
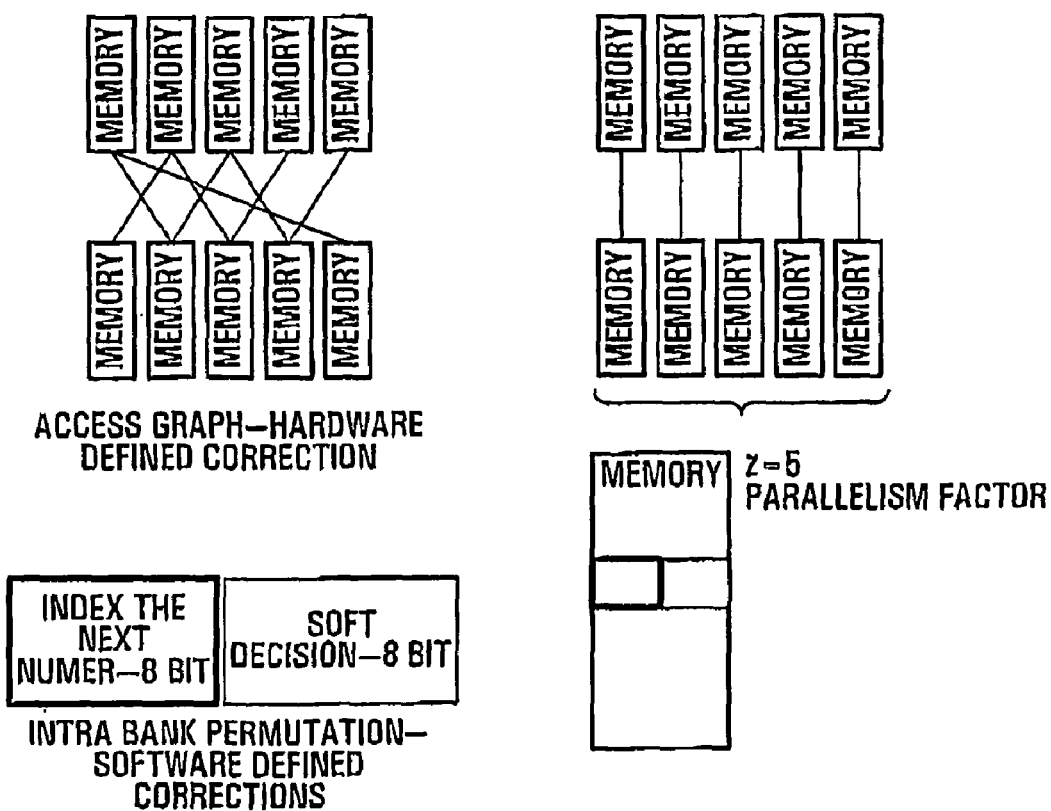
FIG. 18 is a schematic of a interleaver structure.

The requirements to the interleaver can be denoted as
  maximum parallel factor
  no losses in performance (no low weight codewords) with given parallel factor
  Considering the RA code structure one can conclude that
  Parity symbols do not require interleaver, but only repetition with factor 2.
  The systematic symbols need to be repeated with factor of at least 3 to represent each edge on Tanner graph (FIG. 17) before interleaving.
  The random interleaver numbers need to be stored. The implementation for block 1000 bit with repetition factor 7 requires interleaver with size 7000. It takes 7000*14 bits. The on the fly numbers generation is not good idea because it takes FPGA clocks. The dividing interleaver into small interleavers (the number is equal to parallel factor) is the solution. Each small interleaver uploaded into FPGA RAM block. So, each number from interleaver requires 8 bit (see FIG. 18).

The size of RAM blocks at high FPGA boards is large (at least 18 k). This block will not be full and no difference to store 8 bits or 16 bits.

A good interleaver can be found through random search.

Figure 19:
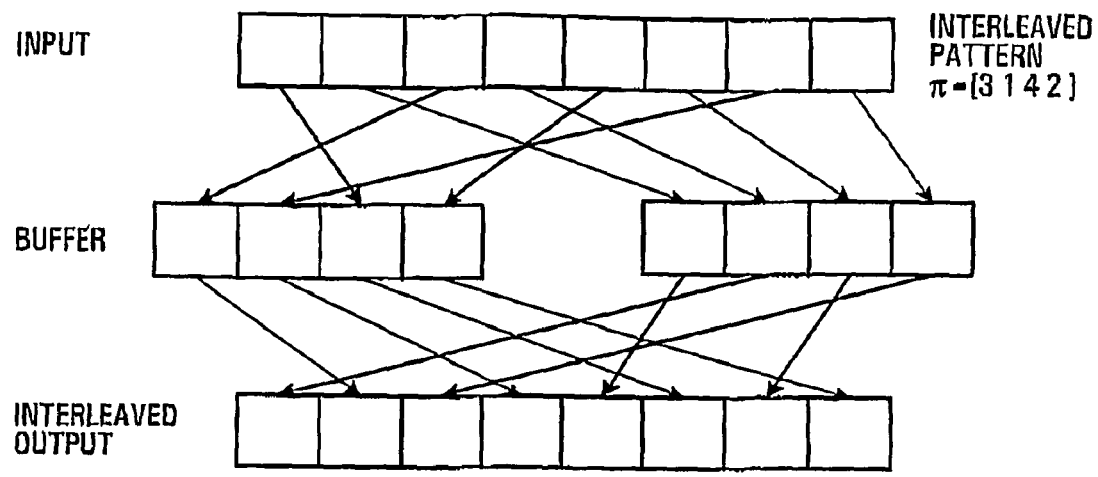
FIG. 19 is a schematic of a even-odd interleaver.
Figure 20:
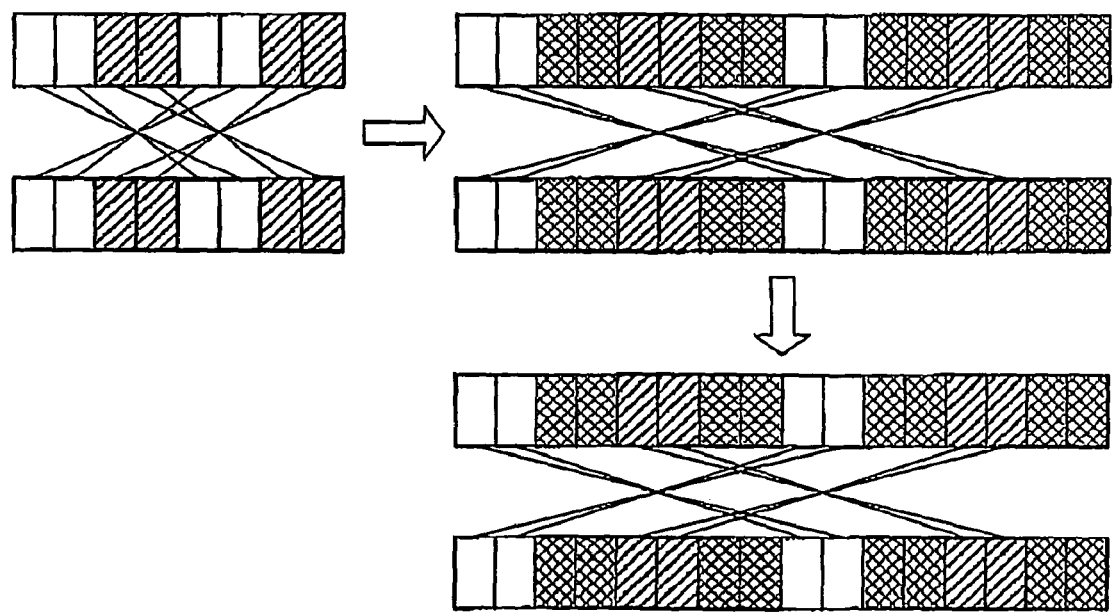
FIG. 20 is a schematic of a expanded odd-even interleaver.

The interleaver memory requirement can be further reduced by using the 2 following techniques:
  a even-odd symmetry
  a expanded interleaver
  The even-odd interleaver is a symmetrical interleaver, it allow to swap the every odd position with an even position, and vice versa. This interleaver structure has satisfied the two restrictions:
  Odd to even conversion; i mod 2≈π(i)mod 2, ∀i
  Symmetry: π(i)=j⇒π(j)=i Assume that only odd position in the interleaver vector are stored. All the stored addresses are then even integers, implying that the LSB in the binary representation of each address is always zero. Thus offering additional memory saving. The operation of odd-even interleaver is shown in FIG. 19.

In order to preserve the odd-even symmetry property, while expand the interleaver length, we need to insert two undefined elements after every second entry in the original interleaver. This modification ensures that each element on an even position in the original interleaver remains on an even position after expansion and vice versa.

Rate Compatible Check Node Processor

Figure 21:
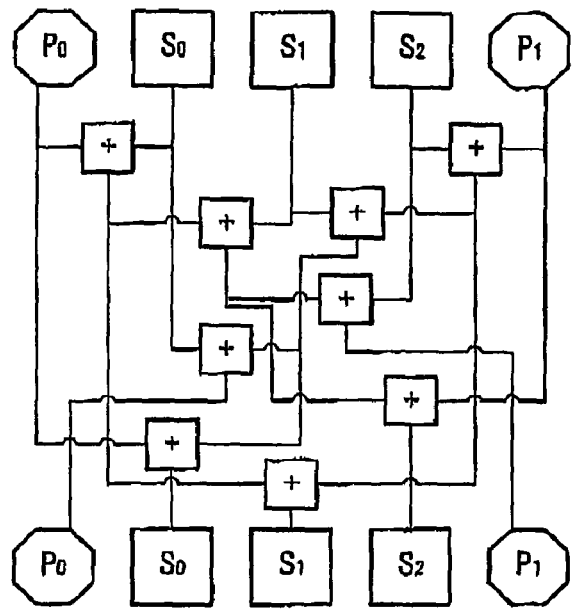
FIG. 21 is a schematic of a elementary check nodes processors.
Figure 21:
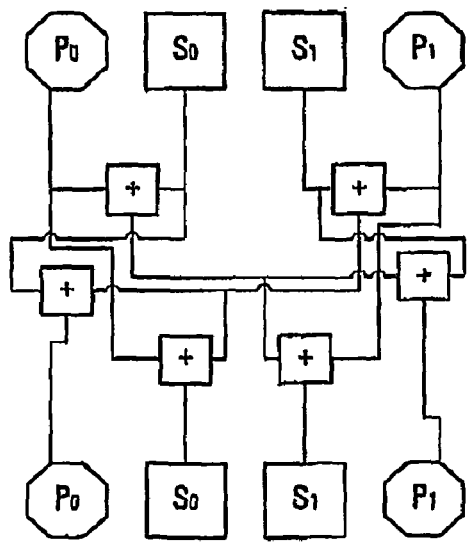
Figure 21:
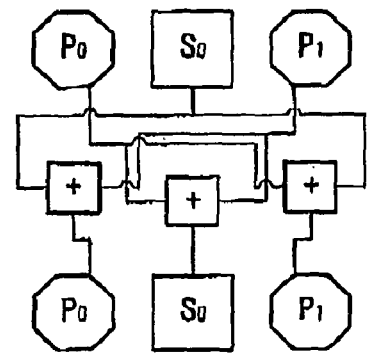
Figure 22:
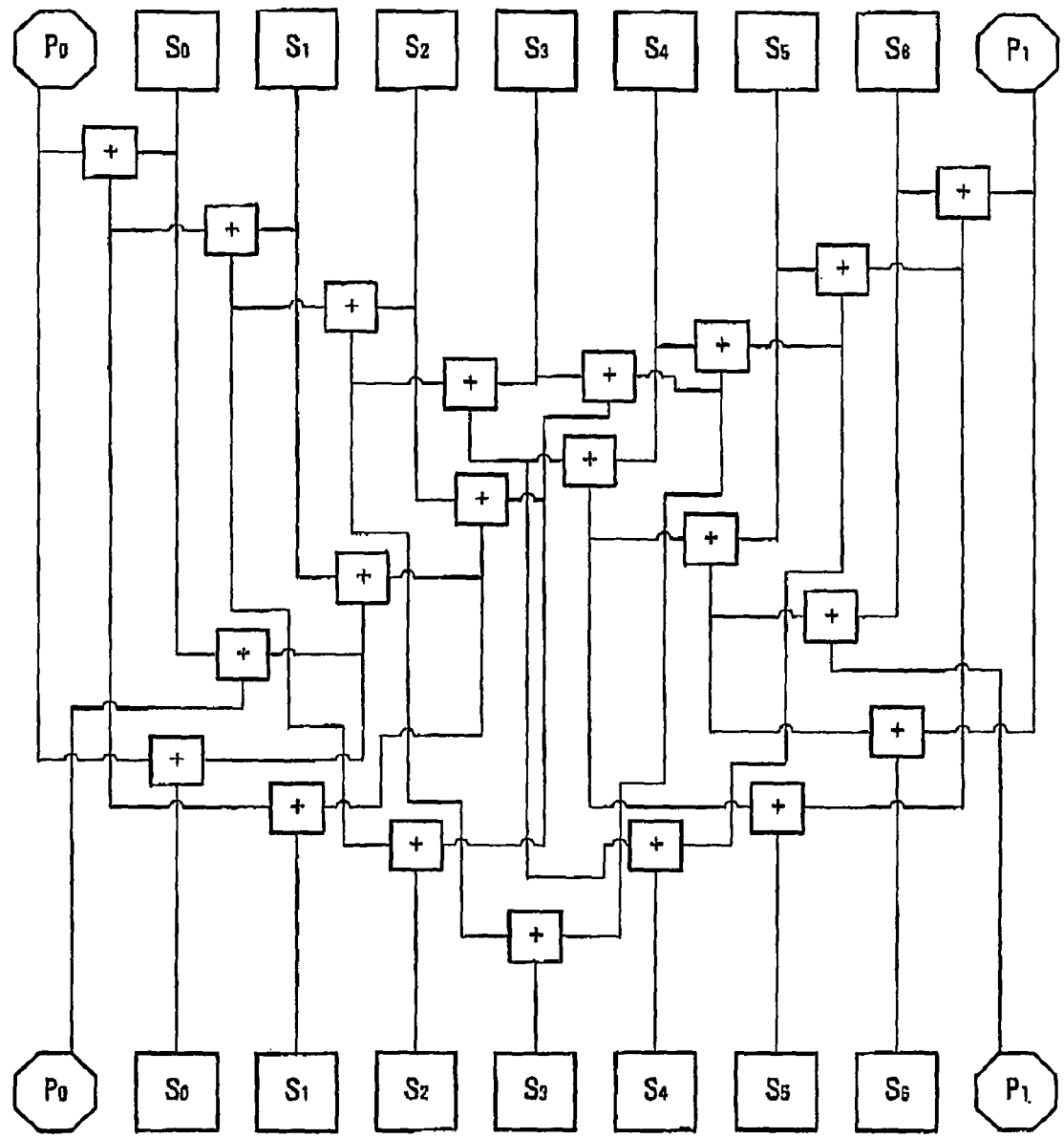
FIG. 22 is a schematic of a check node processor for ½ rate.
Figure 23:
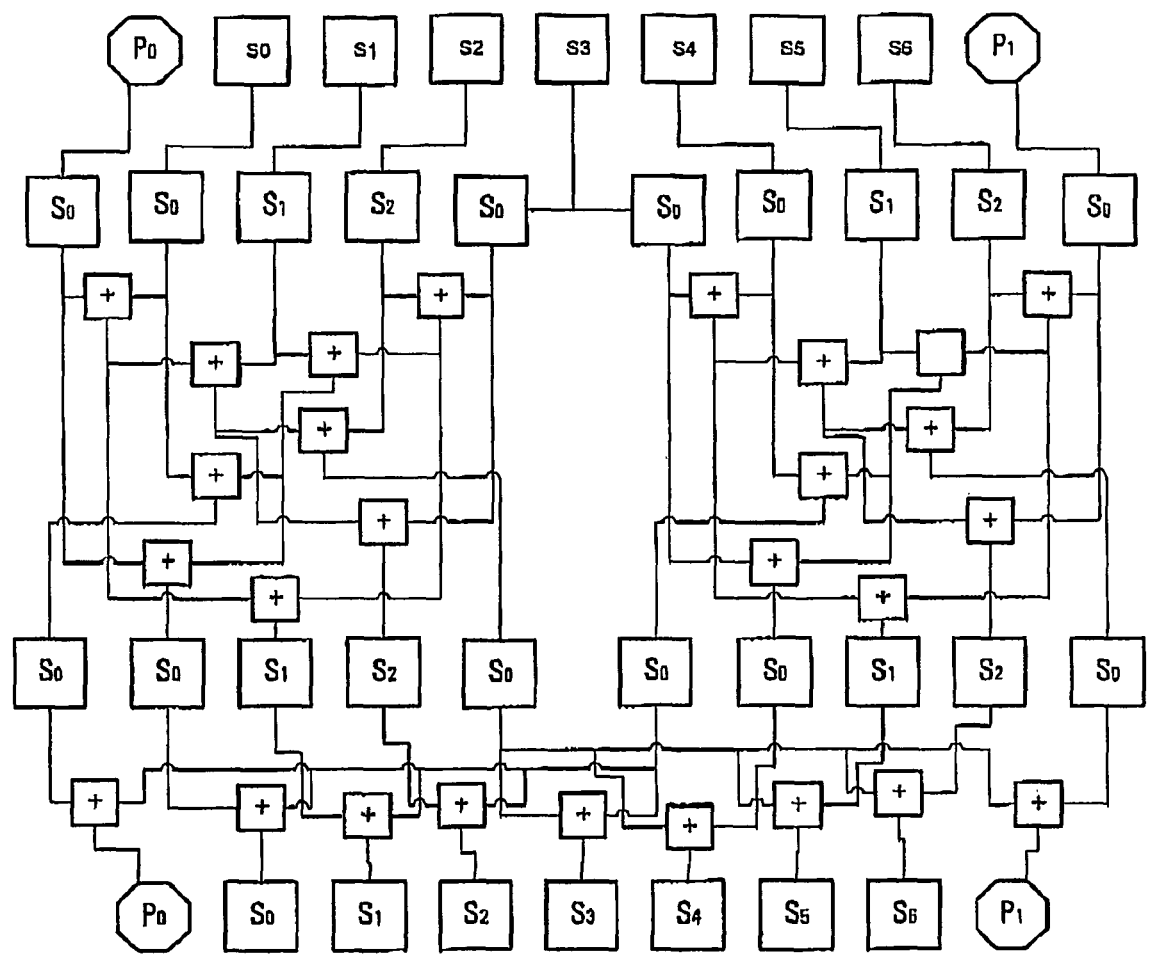
FIG. 23 is a schematic of a check node processor ½ rate variant.

The architecture of rate compatible check node processor is observed. The high rates are obtained by puncturing parity symbols and by concatenation elementary check nodes demarcated by these symbols. The structure of elementary check node processors is shown in FIG. 21 in E-presentation, where; operation+means "box-sum", octagon–parity variable node message, square-systematic variable node message, Parallel application of these processors allows implementation of the rates ⅛, ¼, ⅓.

The following variants are possible starting from the rate ½.

The considered variant has a delay of 8 "box-sum" clocks and requires 7 "box-sum" modules simultaneously at the 8th clock, and 2 modules at all other clocks. Another implementation variant of the processor check node is also possible.

Four modules are required at the first clock, 6—at the second clock, 8—at the third clock, and 7—at the final clock. The peak number of modules is increased up to 8, and the number of required clocks reduced down to 4. In addition, this processor can be used at two rates; ⅓. (close to ⅓) and ½. The results for the check node 3 are ready at the third clock.

Figure 24:
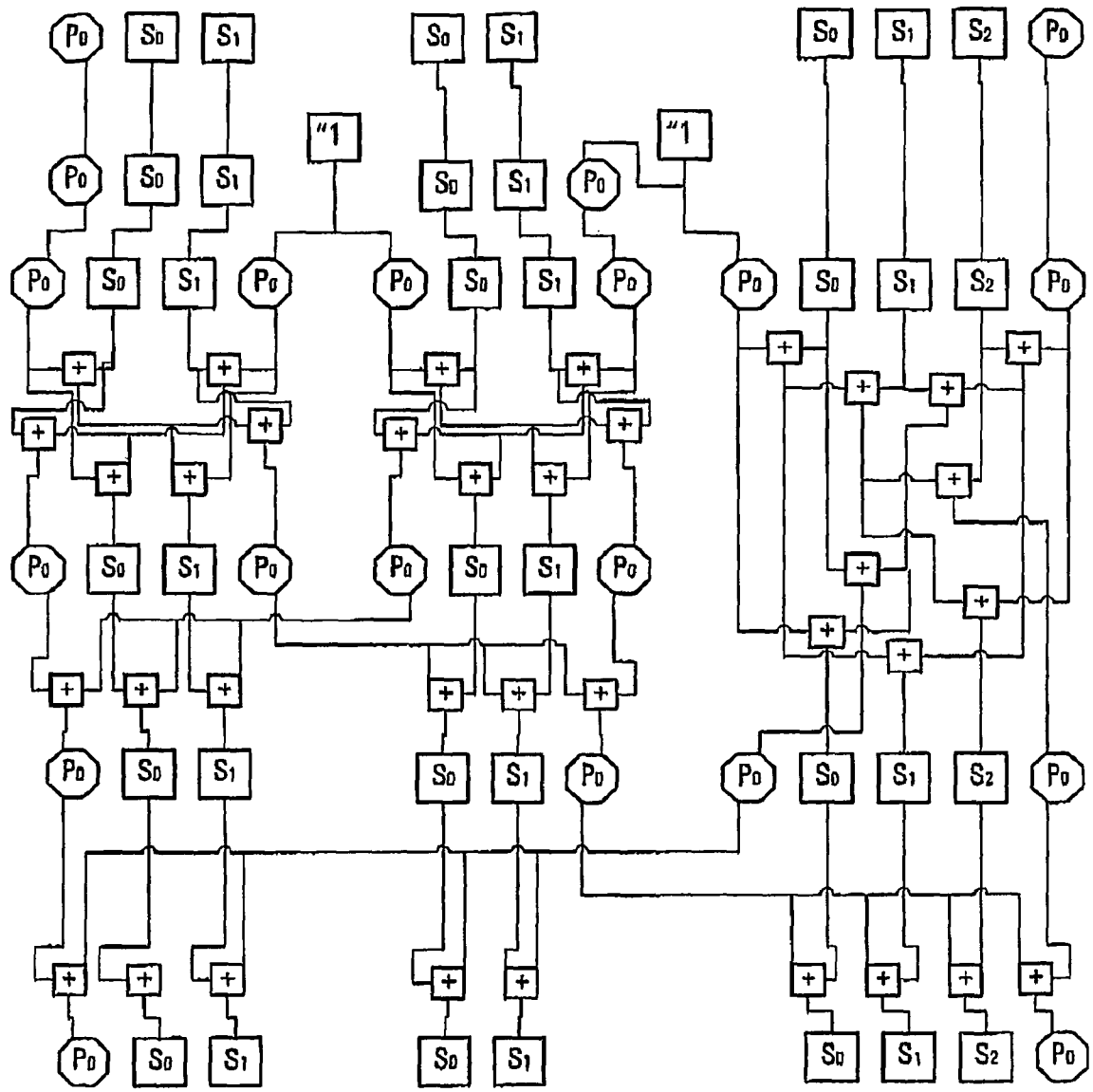
FIG. 24 is a schematic of a rate compatible check node processor ¼ ⅓ ½.

However, in order to align the rate to ⅓, the combinings in the check node are performed in a variable period: 3-4, and the considered architecture generates check nodes by 3. This leads to the following variant of the check node implementation for the rates ¼, ⅓,½, as shown in FIGS. 21, 24.

The cells with "1" are initialized by the greatest number for the selected quantization, which corresponds to the logic unit (1).

The clocks:
$1^{st}$ clock→5 "box-sum" modules
$2^{nd}$ clock→4+4+3=11 "box-sum" modules—peak load
$3^{rd}$ clock→6 "box-sum" modules
$4^{th}$ clock→7 "box-sum" modules Hence, for the rate compatible processor check node, 11 "box-sum" modules (max) and 7 "box-sum" modules (min) are necessary. The computation delay takes 4 clocks of the "box-sum" module (min), and 7 clocks of the "box-sum" modules (max).

Figure 25:
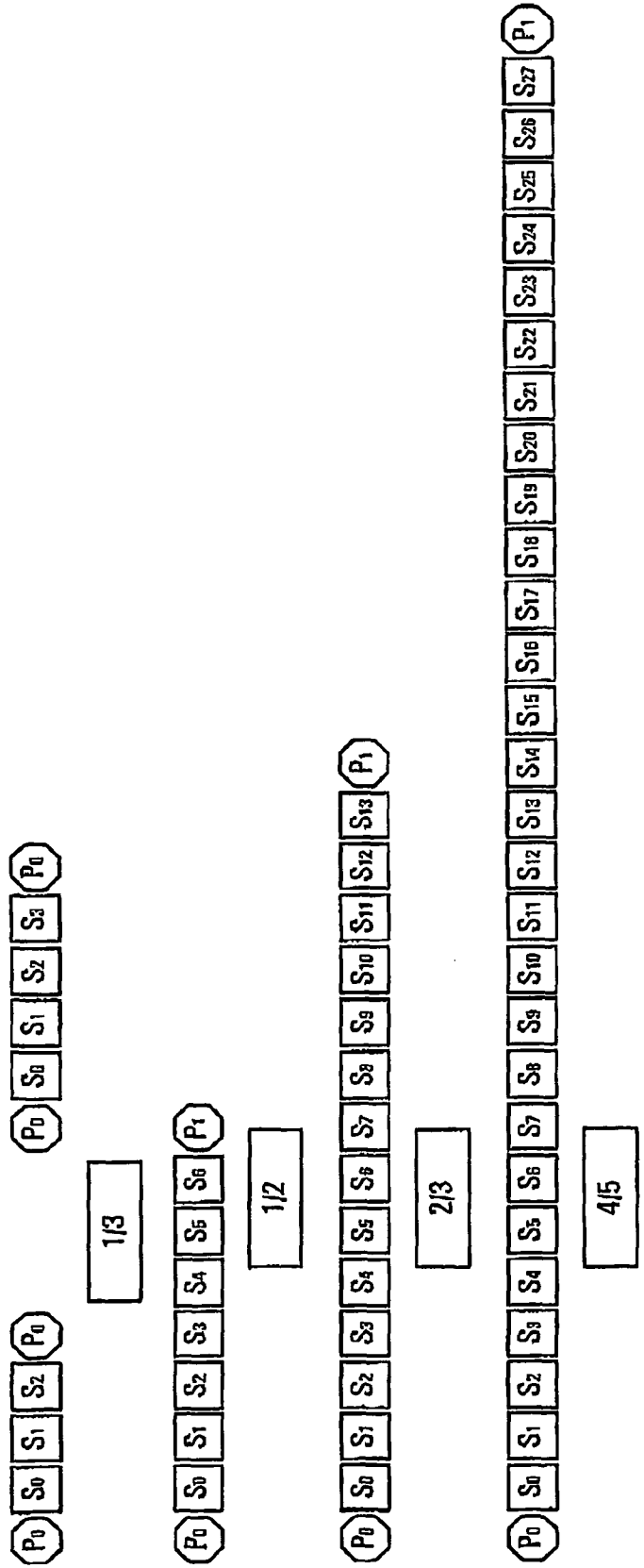
FIG. 25 is a schematic of a rate set construction.

Rate set construction is shown in FIG. 25.

Hence, the rates ⅔, ⅘ are left from a quite easy-implemented rate set

Figure 26:
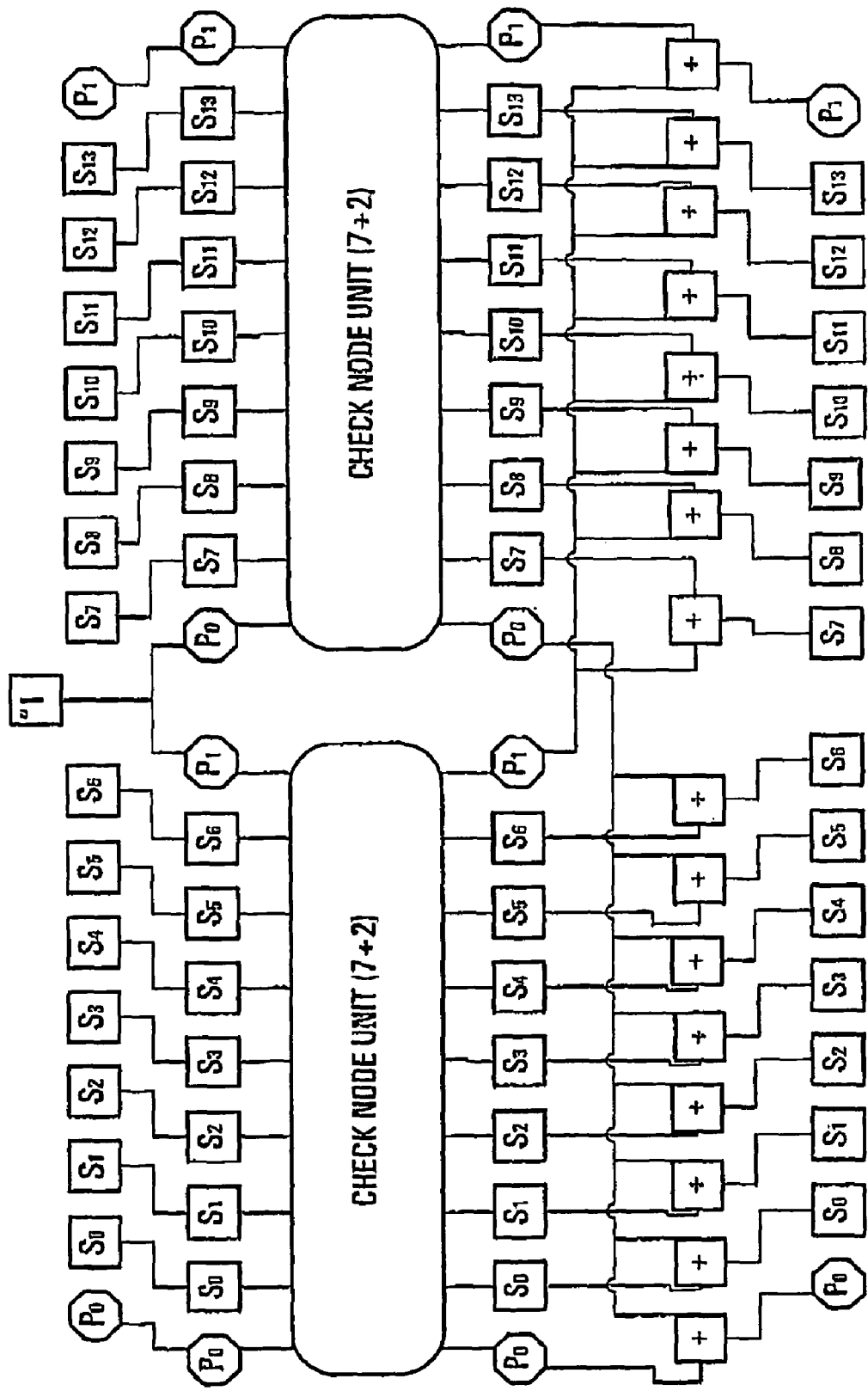
FIG. 26 is a schematic of a check node processor ⅔.

FIG. 26 is an example of a check node processor ⅔.

Figure 27:
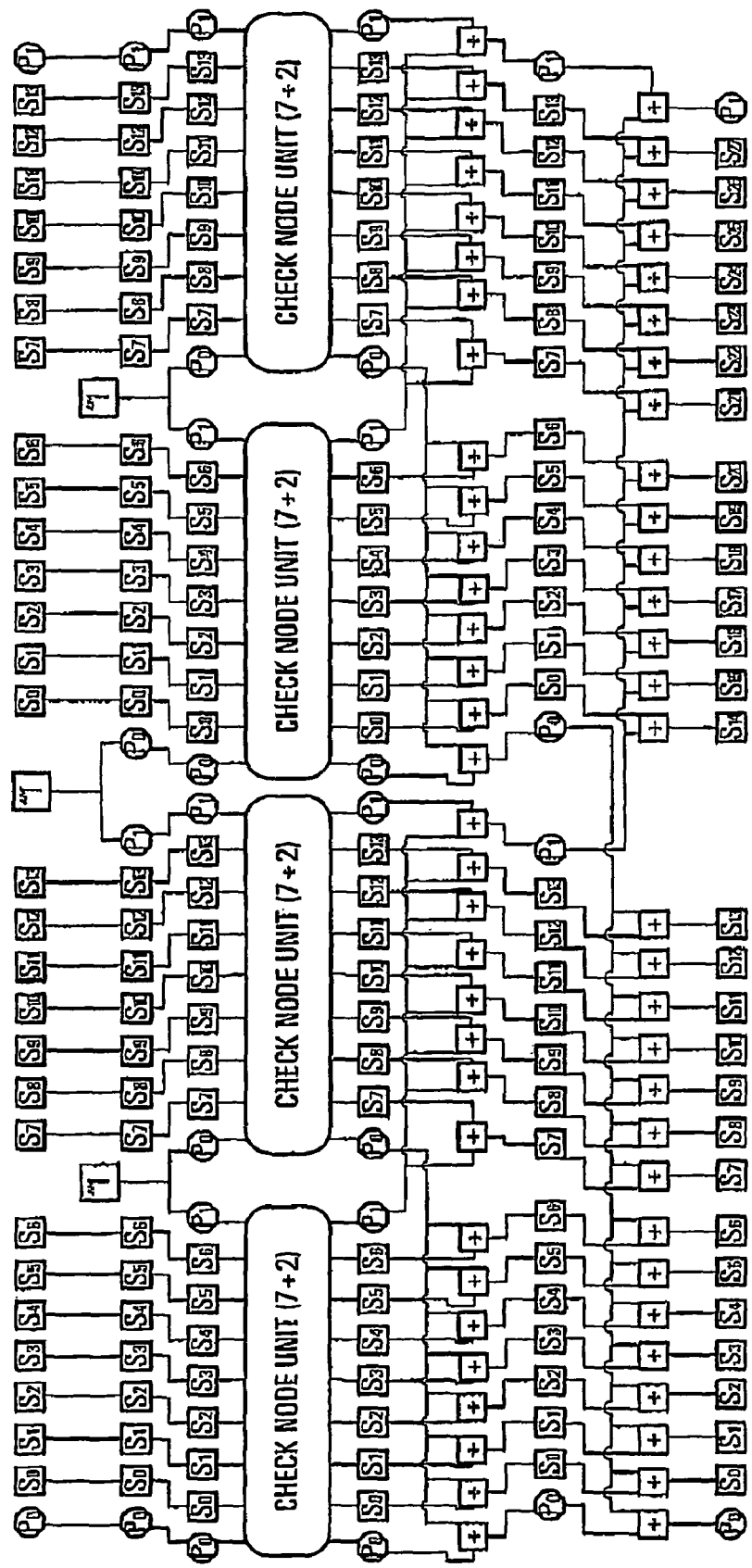
FIG. 27 is a schematic of a check node processor ⅘.

FIG. 27 is an example of a check node processor ⅘.

Complexity Reduced Node Processor Based ln((exp(x)−1)/(exp(x)+1) Function (tan h( ) Rule Based Architecture).

Figure 28:
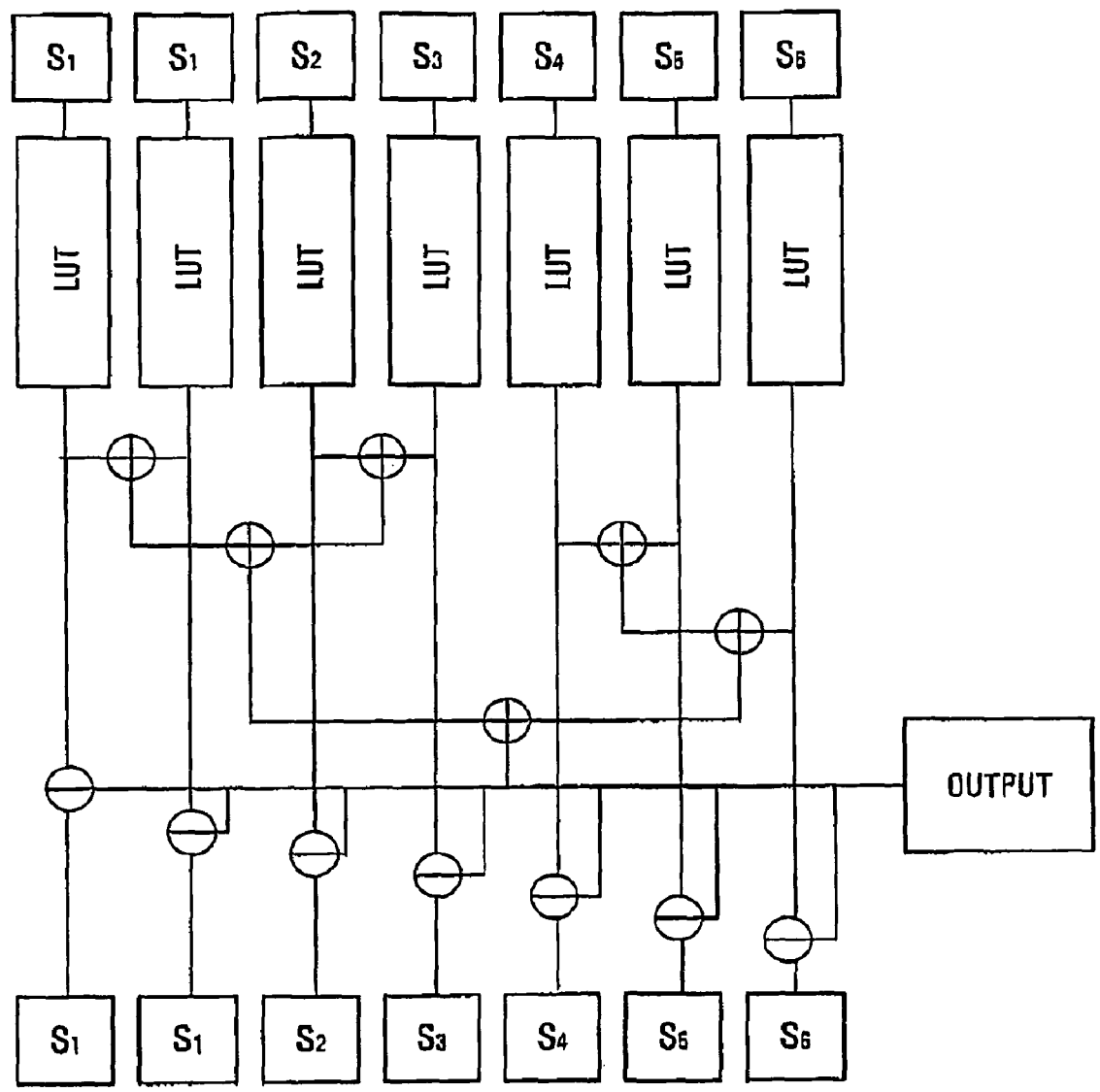
FIG. 28 is a schematic of a node processor base structure (variable and check) without sign determine.

Another architecture of reduced complexity is shown in the FIG. 28.

The LUT (Table 4) is represented by a direct conversion of the type −ln((exp(x)−1)/(exp(x)+1). Due to ache property of this function the same table is used both for forward and reverse conversion.

TABLE 4

| LUT – 6 bits f(x) = {−ln((exp(x/16) − 1)/(exp(x/16) + 1)}*16 | |
|---|---|
| x | f(x) |
| 1 | 55 |
| 2 | 44 |
| 3 | 38 |
| 4 | 33 |
| 5 | 30 |
| 6 | 27 |
| 7 | 25 |
| 8 | 23 |
| 9 | 21 |
| 10 | 19 |
| 11 | 18 |
| 12 | 16 |

TABLE 4-continued

| LUT – 6 bits f(x) = {−ln((exp(x/16) − 1)/(exp(x/16) + 1)}*16 | |
|---|---|
| x | f(x) |
| 13 | 15 |
| 14 | 14 |
| 15 | 13 |
| 16 | 12 |
| 17 | 12 |
| 18 | 11 |
| 19 | 10 |
| 20 | 9 |
| 21 | 9 |
| 22 | 8 |
| 23 | 8 |
| 24 | 7 |
| 25 | 7 |
| 26 | 6 |
| 27 | 6 |
| 28 | 6 |
| 29 | 5 |
| 30 | 5 |
| 31 | 5 |
| 32 | 4 |
| 33 | 4 |
| 34 | 4 |
| 35 | 4 |
| 36 | 3 |
| 37 | 3 |
| 38 | 3 |
| 39 | 3 |
| 40 | 3 |
| 41 | 2 |
| 42 | 2 |
| 43 | 2 |
| 44 | 2 |
| 45 | 2 |
| 46 | 2 |
| 47 | 2 |
| 48 | 2 |
| 49 | 1 |
| 50 | 1 |
| 51 | 1 |
| 52 | 1 |
| 53 | 1 |
| 54 | 1 |
| 55 | 1 |
| 56 | 1 |
| 57 | 1 |
| 58 | 1 |
| 59 | 1 |
| 60 | 1 |
| 61 | 1 |
| 62 | 1 |
| 63 | 1 |
| 64 | 1 |

The bit width increase over 6 bits is not a problem. The input values are quantized in this case in 7 bits without zero. The 6th bit is the soft decision module, the 7th bit is a sign bit. In this case the LUT can be added by zero f(0)=0. This zero bears no physical meaning and will be used for combining of different node processors in the variable rate decoder.

Figure 29:
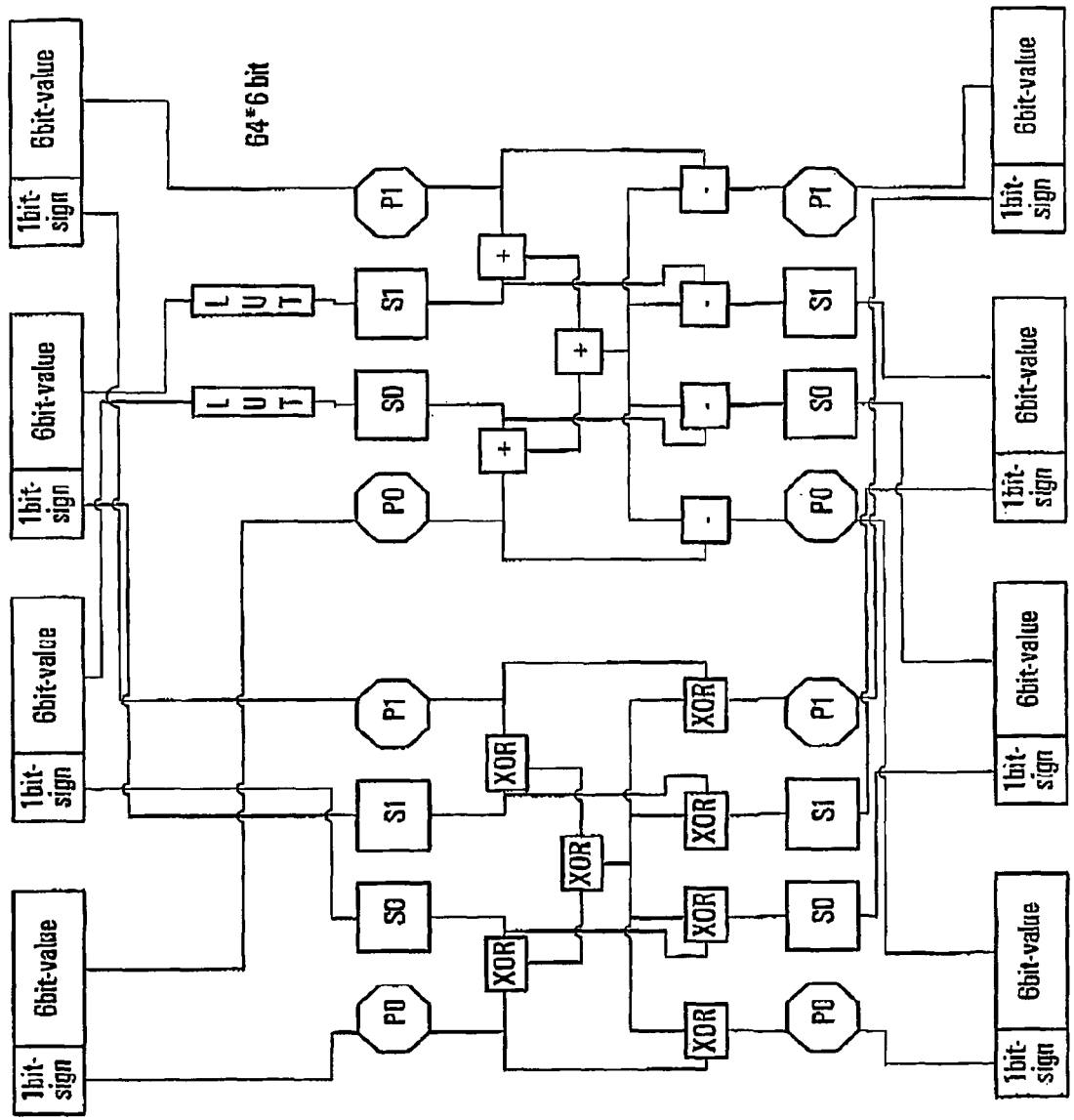
FIG. 29 is a schematic of a complete check-node processor structure 2+2. LUT except parity symbols.
Figure 30:
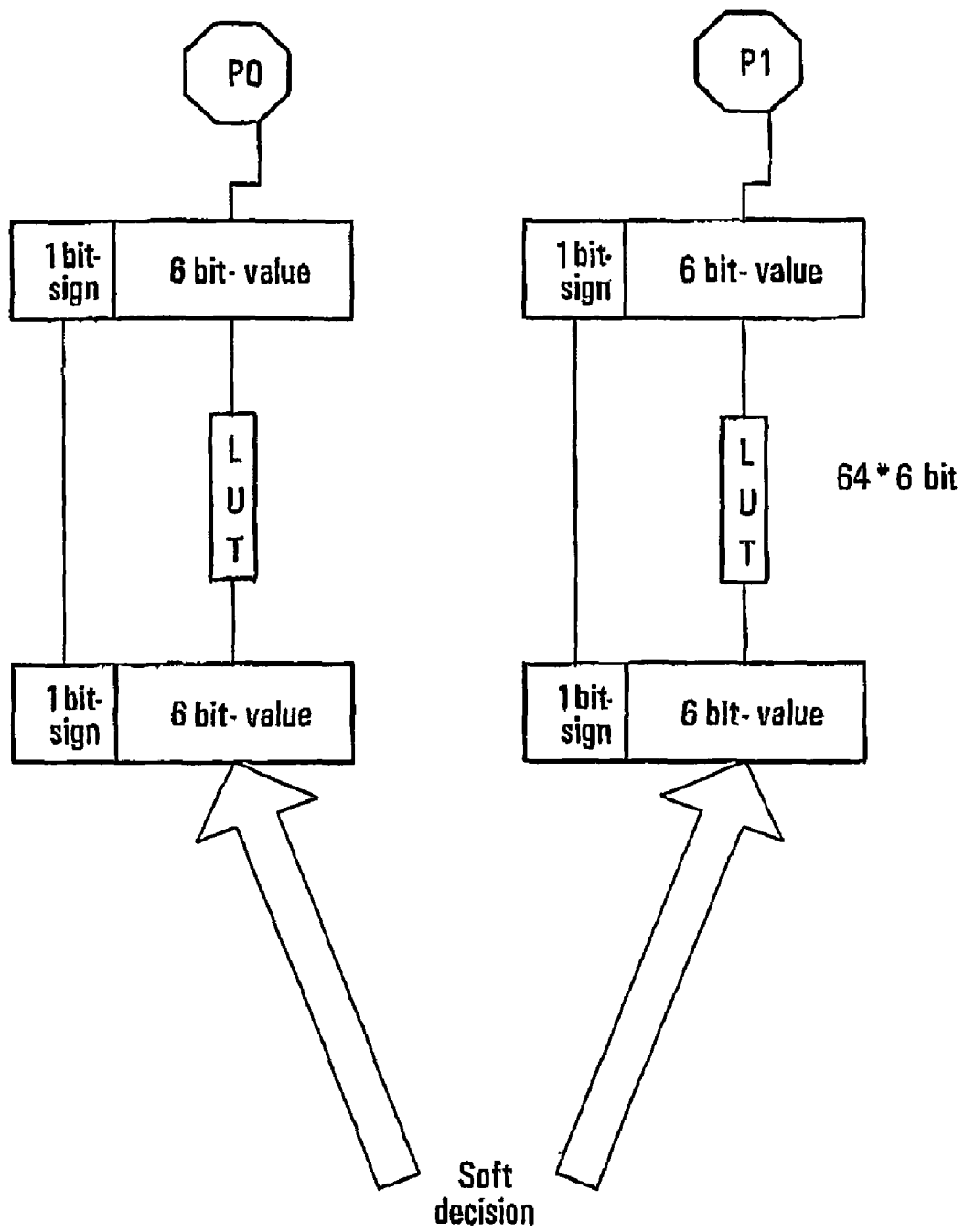
FIG. 30 is a schematic of a initialization of the parity check node.
Figure 31:
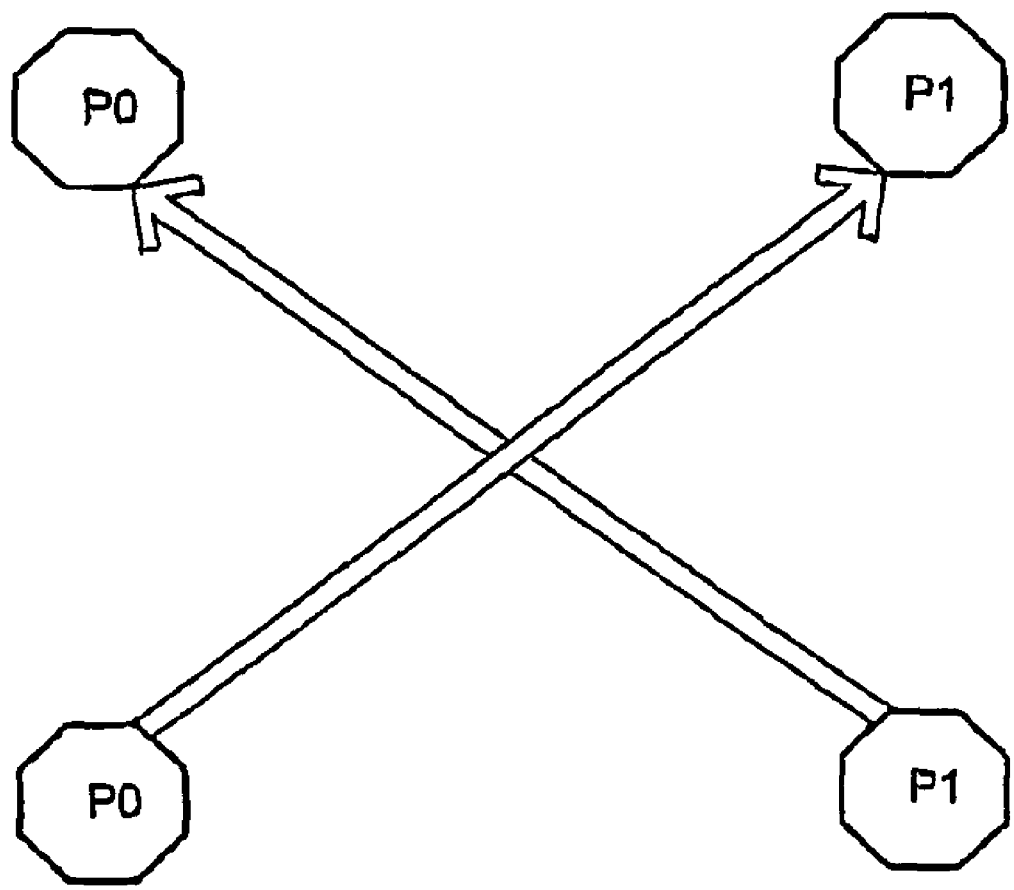
FIG. 31 is a schematic of a processing by the parity variable node processor (no computation needed)
Figure 32:
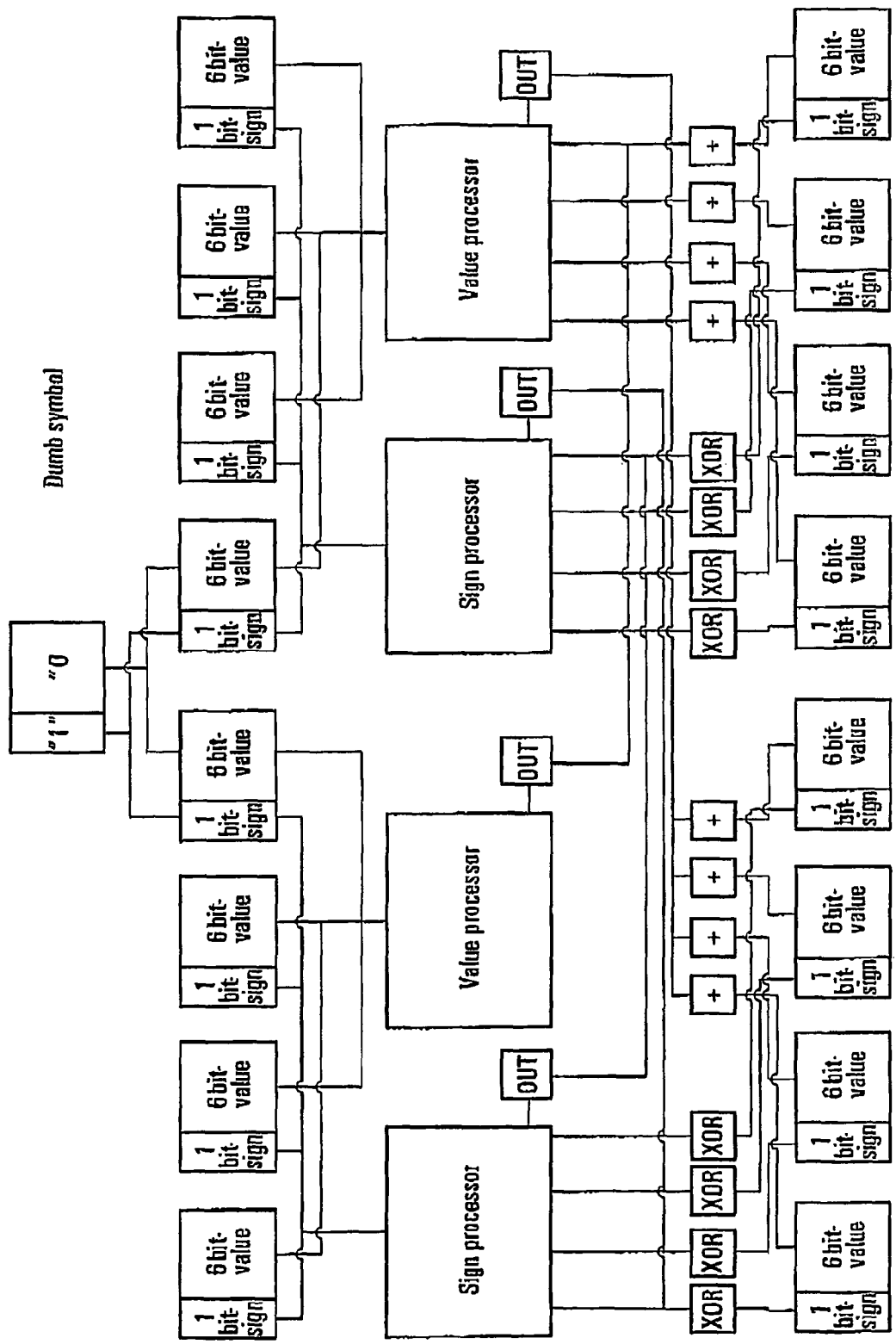
FIG. 32 is a schematic of a concatenated check node processor with dumb symbol puncture.
Figure 33:
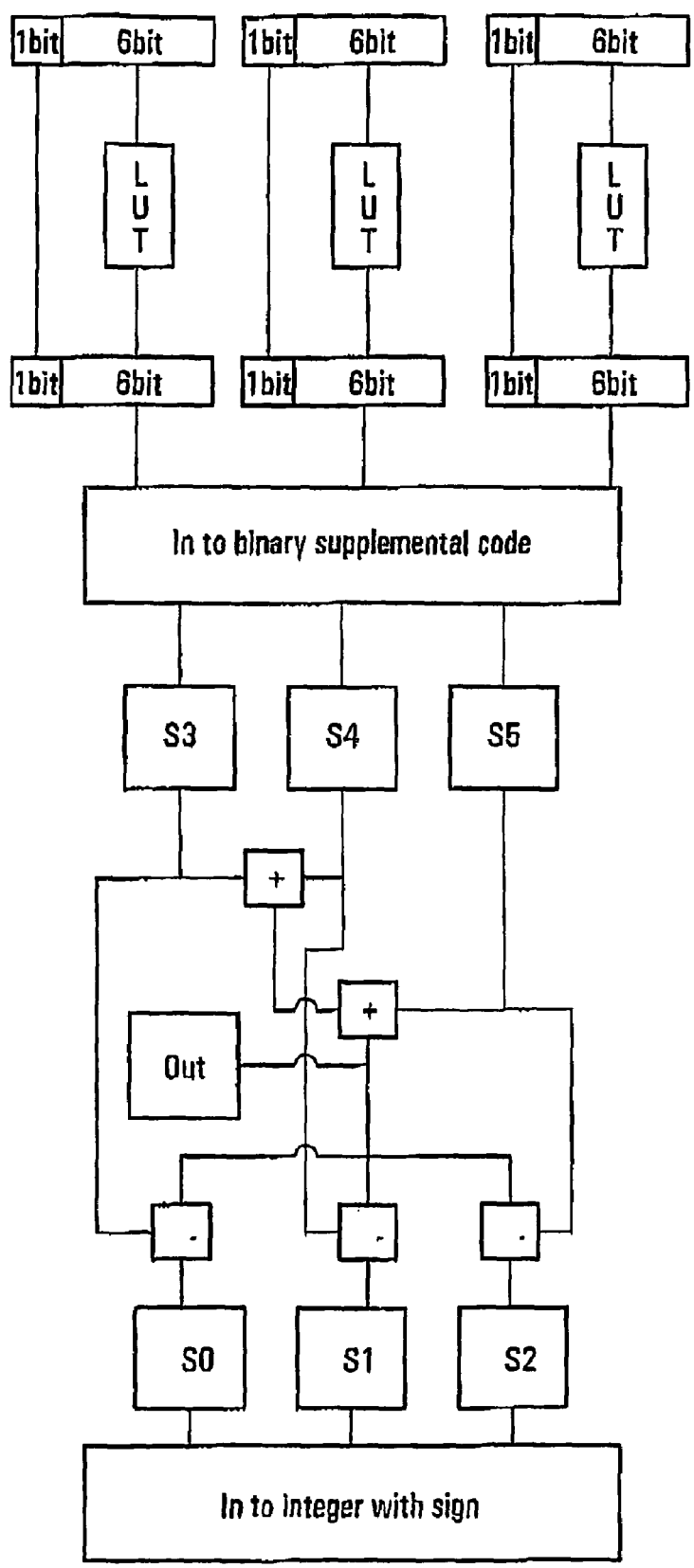
FIG. 33 is a schematic of a variable node processor 3.

The adders FIG. 28 are conventional integer number adders. FIG. 28 shows a scheme of the outgoing message detection module, which should be completed by the outgoing message sign definition scheme. The computations at the sign processor are similar to those of the module definition scheme, differentiated by XOR instead of adding. Also the variable node structure must be completed by the number conversion from the sign format into the binary-complement code, as the sign adding (performed at the variable node) is more convenient to be performed in such format. The complete structure of the check-node processor 2+2 is shown in FIG. 29. Note, LUT conversion is not required for the parity symbols in the IRA code, as their processing at the parity node considers simple transposition (FIG. 31). LUT-conversion is performed while initialization (FIG. 30). The structure of the composite node processor included constituent node processors used for the variable rate decoder is shown in FIG. 32. This structure supposes the usage of two node processors where the punctured parity symbol is initialized by a logic unit (1) with zero amplitude, and this symbol is included into both constituent processors. The sign of the message obtained at composite node processor is obtained by XOR of the message sign of the corresponding constituent node processor with the OUT sign of second constituent node processor. The message amplitude obtained at the constituent node processor is generated by addition of the amplitude obtained by the corresponding constituent node processor with the OUT amplitude of the second constituent processor. The structure of the variable node processor is shown in FIG. 33. The incoming message amplitude is converted by LUT by the same table without conversion of the sign. The obtained values are converted into the binary-complement code. After summations, the outgoing messages are generated by conversion of these messages into an integer with a sign.

The structure of the variable node processor, processing greater number of messages, is similar to that shown in FIG. 33. In the result, the sum with the sign of all converted incoming messages is written into the OUT cell, being the soft data bit decision, the outgoing message is obtained by subtraction of the LUT conversion of corresponding incoming message from OUT.

Implementation Issues and Operation Speed Estimation

The choice of repeat accumulative encoding scheme is made for the following reason:
  simple as possible encoding
  code contain systematic and parity parts
  trivial interleaver for parity symbols
  reduce to a minimum parity symbols repetition (2—two time).

The operation speed estimation formula may be rewritten without coding rate.

$$T = \frac{Z * F_d}{I * \alpha} \tag{15}$$

where Z-interleaver parallel factor α-repetition factor of systematic bits. Fd—the FPGA board clock rate I—number of iteration.

The following problem is considering in the next section: How to upload parallel data stream to the interleaver with irregular repetition. It is possible to combine symbols with different degree of repetition to blocks with fixed rate, which length is equal parallel factor of the interleaver.

Irregular Codes

The purpose of computations at the variable node processor is reduced to calculation of the sum of all node-related messages except the message for which a response message is calculated.

Figure 11:
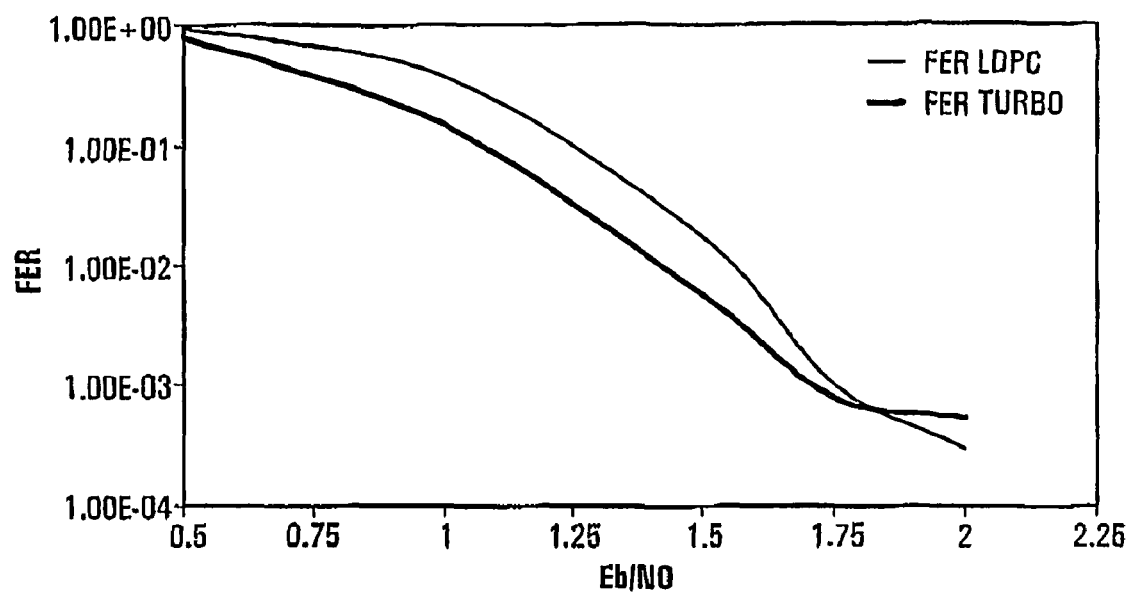
FIG. 11 is a plot of FER vs Eb/NO Variable rate decoder structure.
Figure 34:
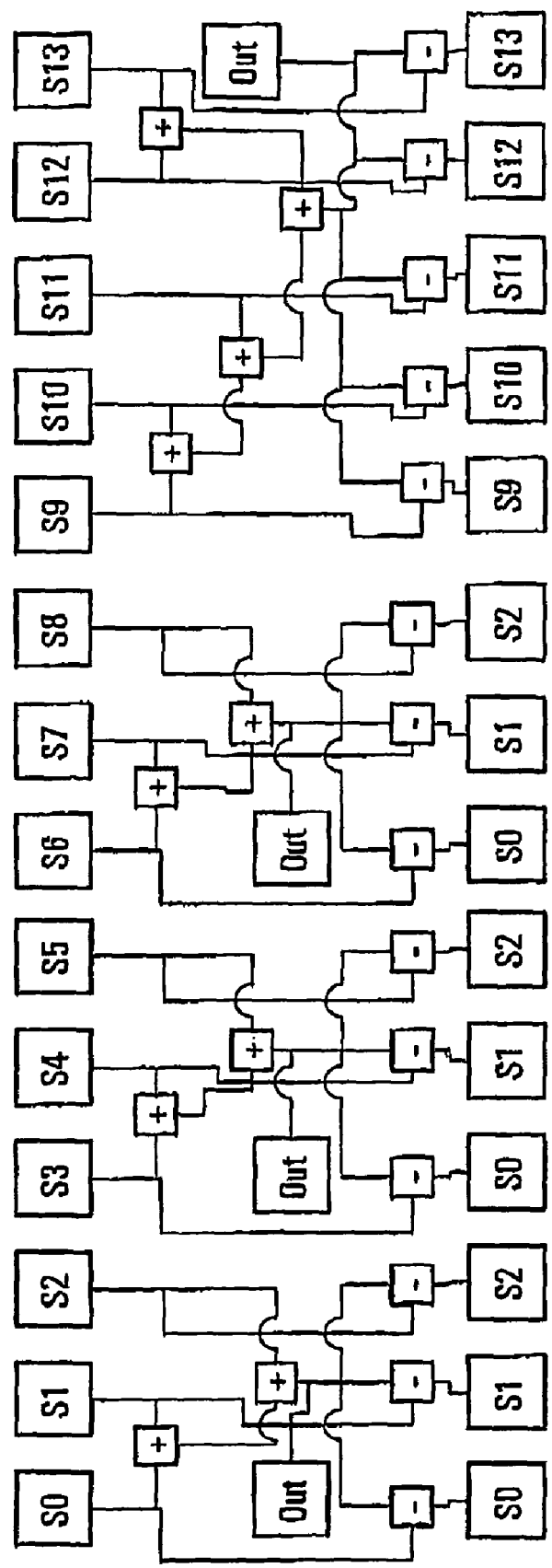
FIG. 34 is a schematic of a variable node processor 3-3-3-5.
Figure 35:
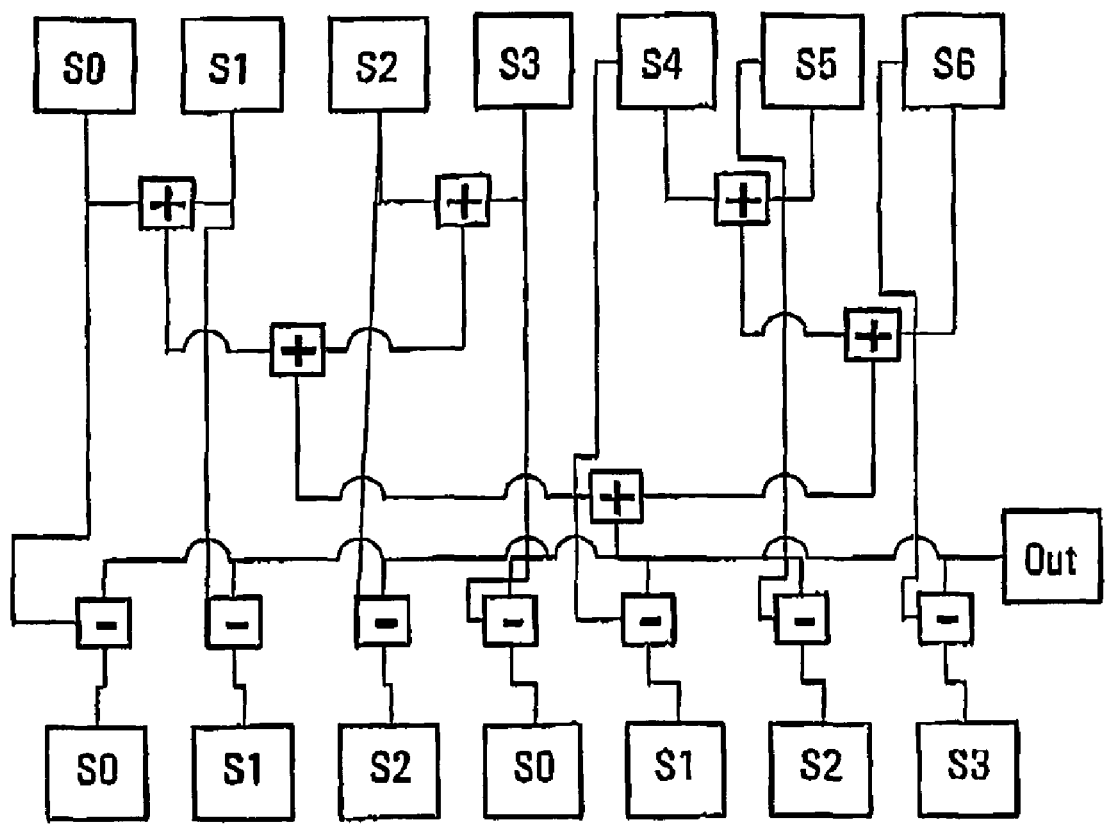
FIG. 35 is a schematic of a variable node processor 7.

For the variable parity node, with the degree of two, this operation is trivial: 2 numbers exchange their places. Such operation is performed directly after the processor check node being an analog of the systematic node interleaving. In order to simplify the variable node processing, the irregular repetition table is selected to maintain the number of repeated symbols multiple to the number of memory banks used for the message storage. In the present case this number is equal to 28, it is also the greatest number of messages that can be parallel processed by the check node processor. Obviously, the number of parallel processed messages cannot be greater than such number The irregular repetition table can be organized in the following manner:

There are tolerable sequences of repeated symbols, such that the number of repeated symbols is multiple to 7 and is below 28.
  3 3 3 5—4 information symbols are in all repeated 14 times FIG. 34
  7—any number of messages can be repeated 7 times FIG. 35
  11 3—the first bit is repeated 11 times, and the next bit is repeated 3 times
  13 15—data bit are in all repeated 28 times
  28—the greatest number of repetitions of one bit.

In addition to the outgoing message calculation from variable node, the output soft decisions are generated for the decoder by the processor. Such soft decisions can be used directly for the data unloading in the course of iteration. Here the operation "+" is summing with a sign.

Figure 36:
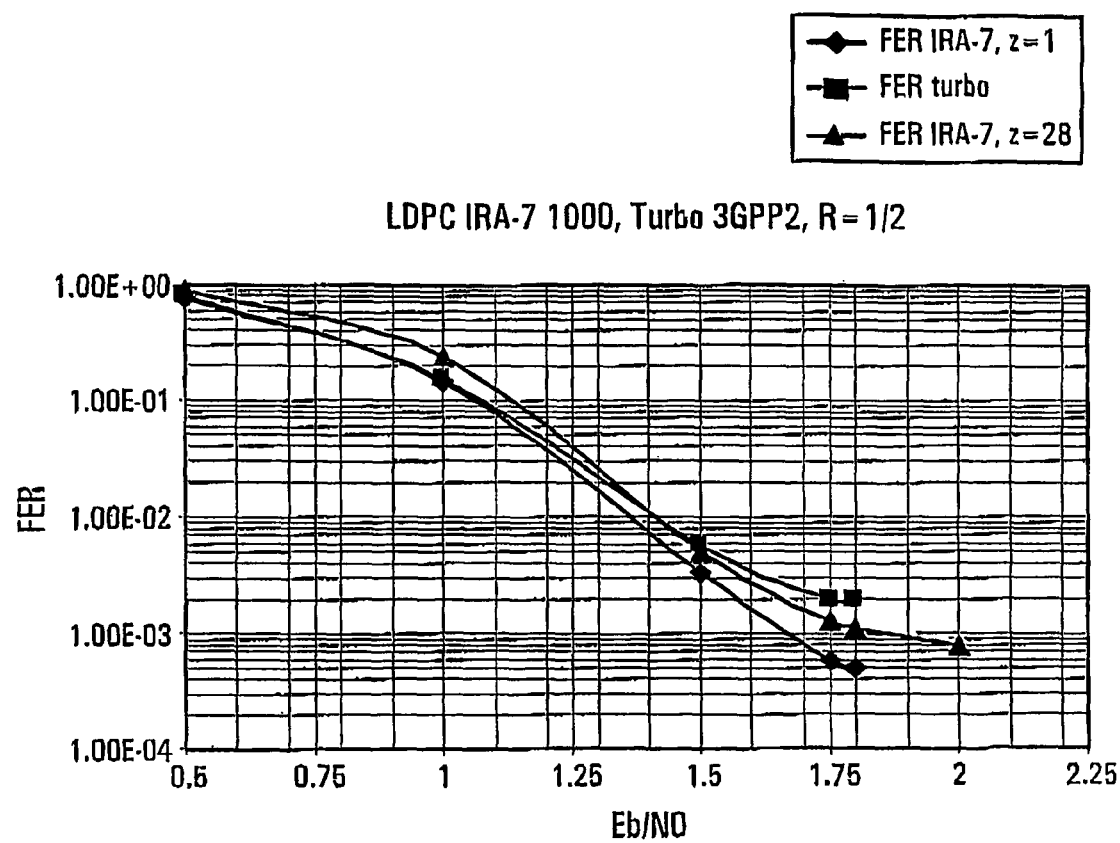
FIG. 36 is a plot of IRA-7 vs. 3GPP2 turbo code comparison FER.
Figure 37:
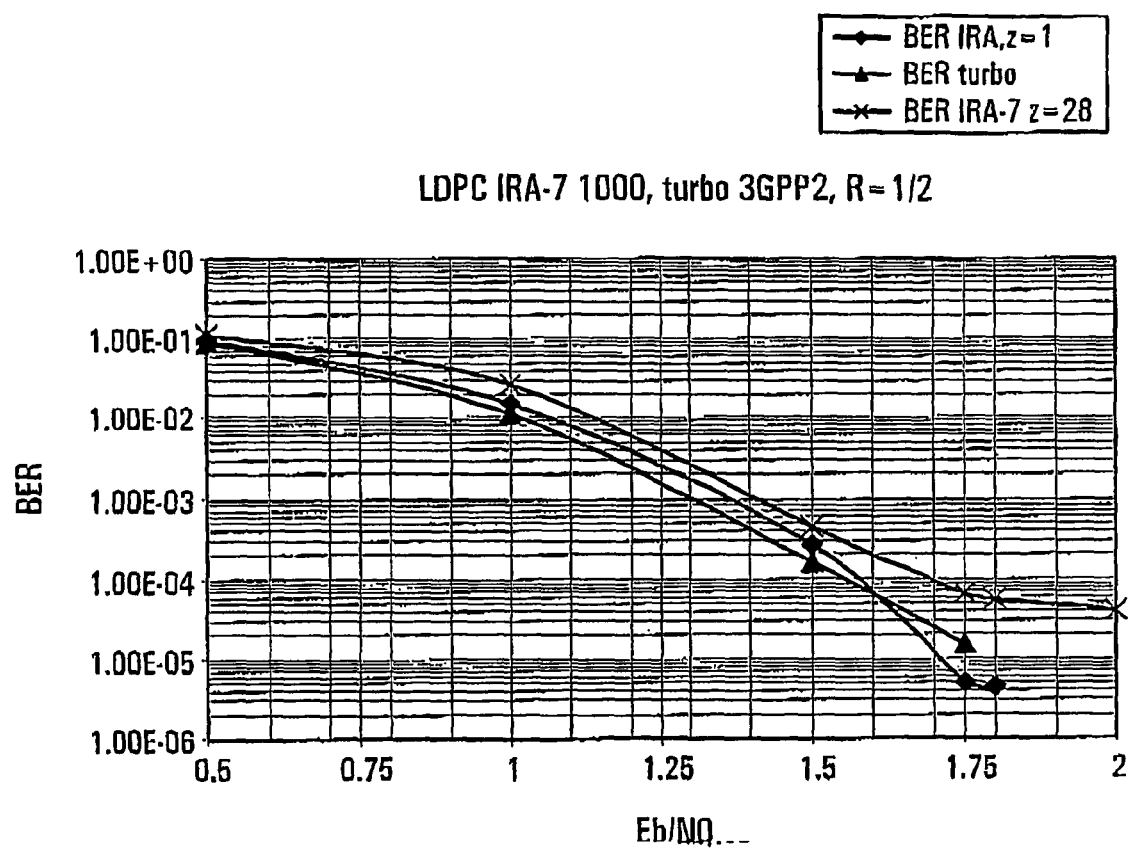
FIG. 37 is a plot of IRA-7 vs. 3GPP2 turbo code comparison BER.

On FIG. 36 and FIG. 37 show code design losses of the hardware constraints (interleaver and repetition table). As seen from the figures, there is no great loss in block error in respect to the turbo code, though the loss in respect to the random IRA code is observed.

The operation speed estimation is T=(Z*Fd)/(I*Alpha)=(28*Fd)/(I*7). Let number iteration be I=24, and Fd=100 MHz (28*100 MHz)/(24*7)=100 MHz/6=15 MBps. Maximum 32 parity symbols need to be uploaded in parallel, so minimum 16 blocks need to store them. Memory allocation 7000/250+16=28+16=44 RAM blocks minimum.

Simple Puncturing or Check Node Concatenation.

Figure 38:
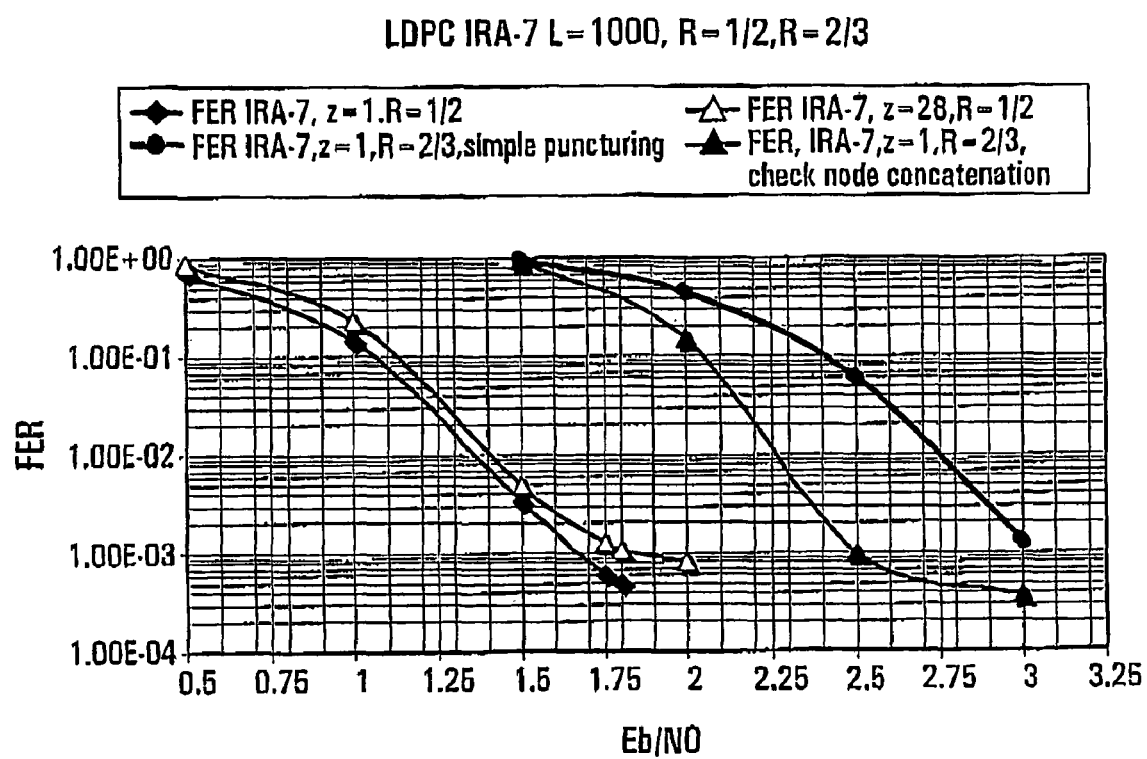
FIG. 38 is a plot of simple puncture losses FER.
Figure 39:
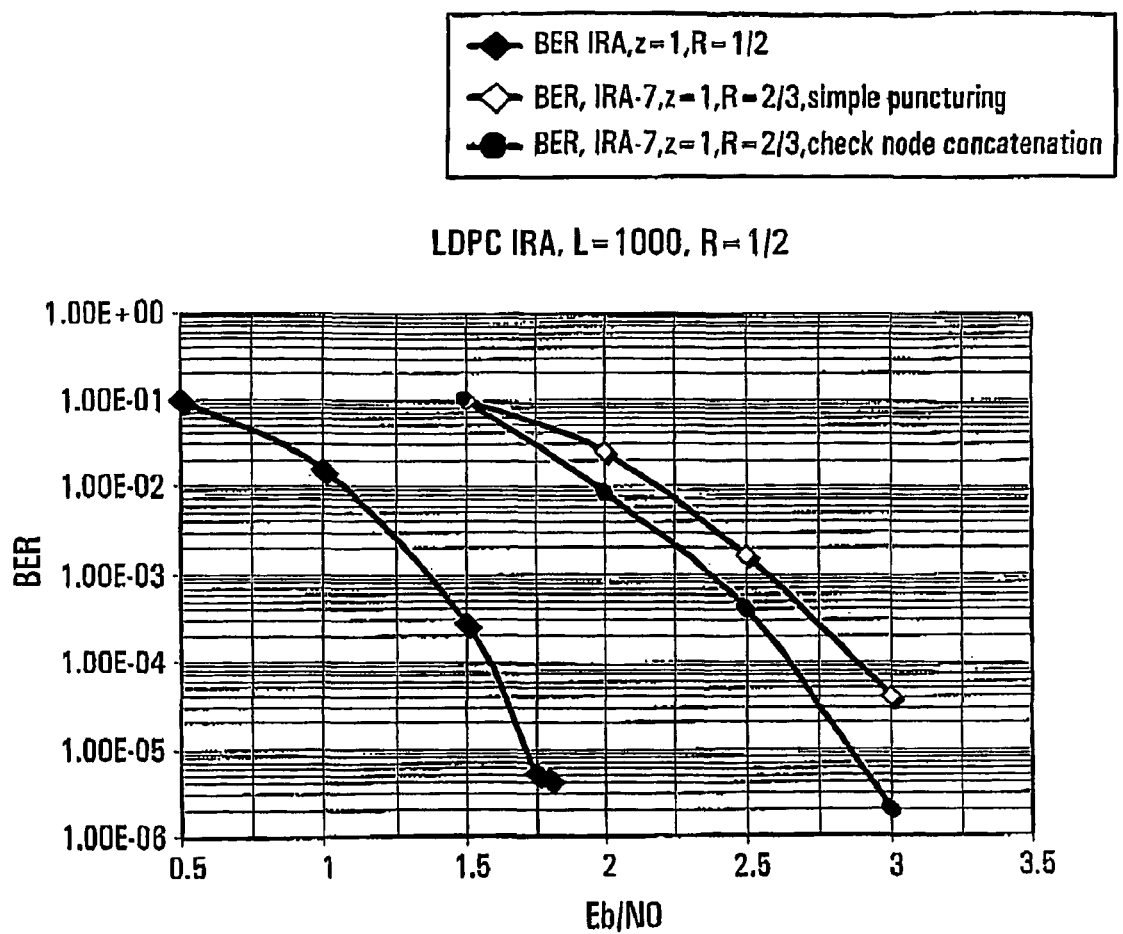
FIG. 39 is a plot of simple puncture losses BER.

Simple puncturing work, but have 1 dB loss on FER=0.01, compared with check node concatenation. But algorithms of check node concatenation (FIG. 32, FIG. 26, FIG. 27) required more logic FPGA board. The simulation results are presents in FIG. 38 and FIG. 39.

Regular Codes

To increase throughput and operation speed the regular repeat accumulative codes are implemented. The repetition factor was decreased to 3. That means every systematic bit is repeated only 3 times. The parallel factor 72 is achieved by reducing the interleaver diversity (S-factor). The interleaver size is 9000 and the systematic part size is 3000. The coding rate is ½.

Figure 40:
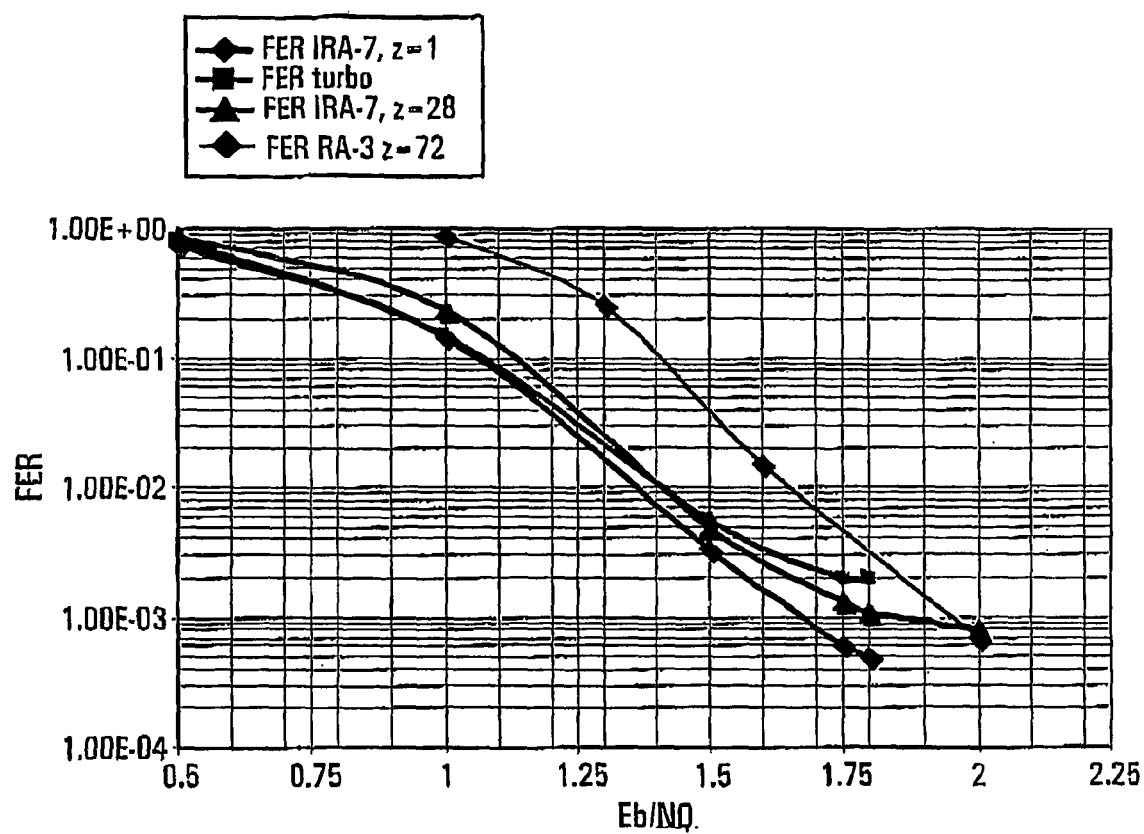
FIG. 40 is a plot of repeat Accumulative code FER.
Figure 41:
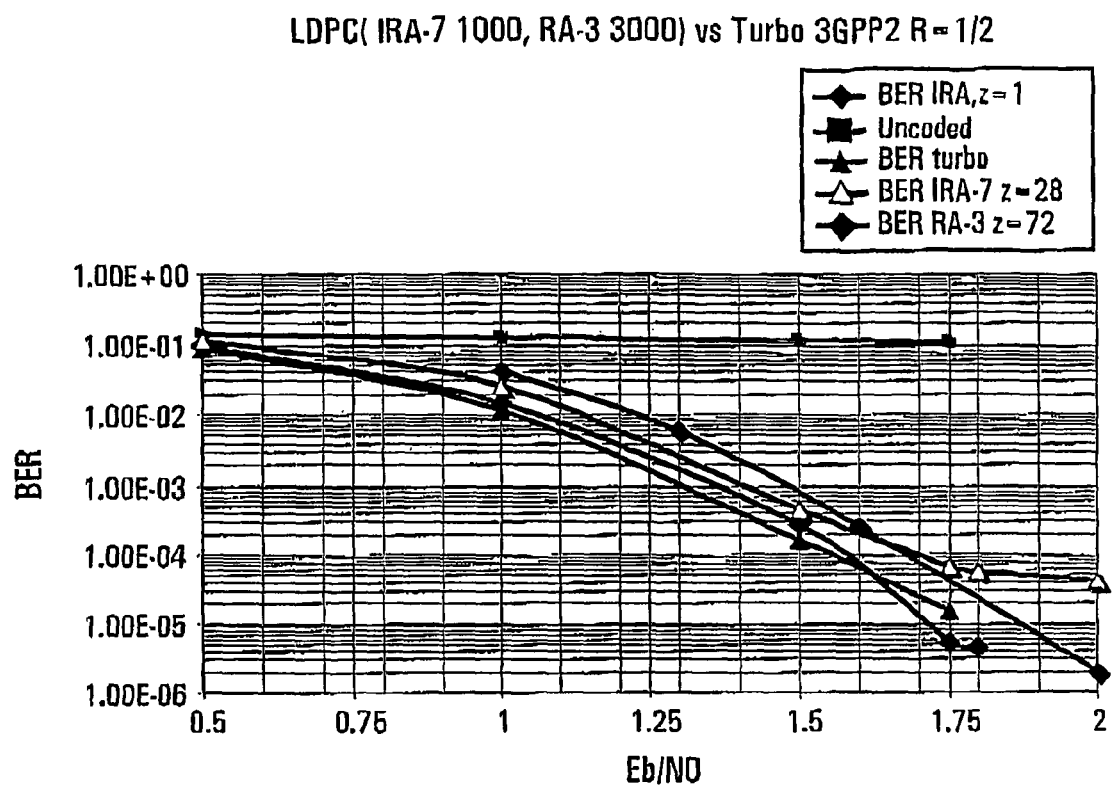
FIG. 41 is a plot of repeat accumulative code BER.

The performance losses of regular codes are negligible. There is no problem with parallel data stream uploading. See FIGS. 40 and 41.

The operation speed estimation is T=(Z*Fd)/(I*Alpha)=(28*Fd)/(I*7). Let number iteration be I=24, and Fd=100 MHz (72*100 MHz)/(24*3)=100 MHz=100 MBit/s. Maximum 48 parity symbols need to be uploaded in parallel, so minimum 24 blocks need to store them. Memory allocation 9000/125+48=72+48=120 RAM blocks minimum Impact Of Reducing Repetition Factor The following simulation gives the answer to this question. The same interleaver is used with data repetition factor 3, 2, 1. The first code operates at rate 3000/(3000+3000)=½, the next operates at rate 4500/(4500+3000)=⅗, the last one operates at rate 9000/(9000+3000)=¾

Figure 42:
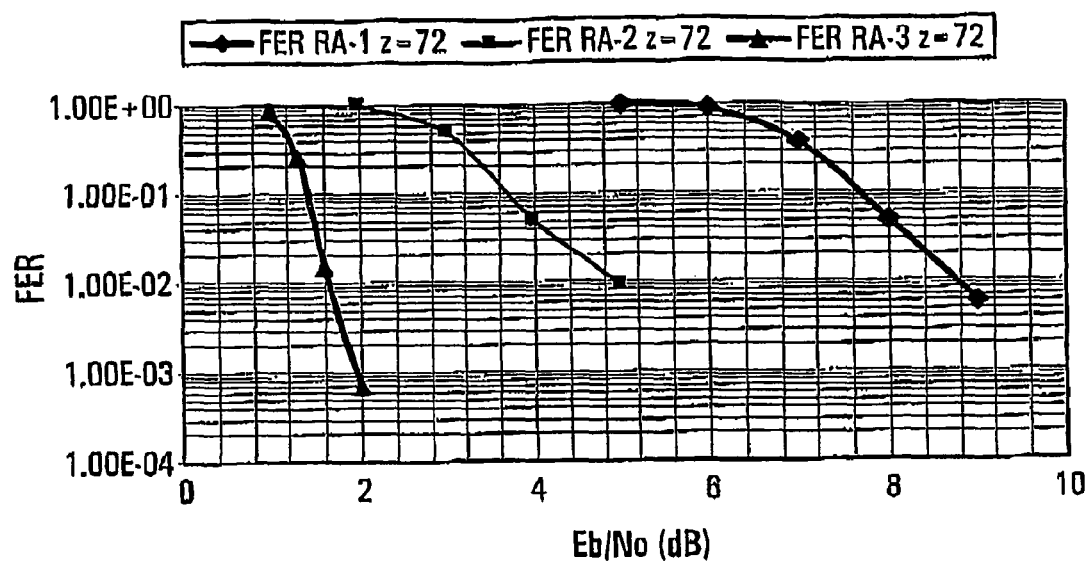
FIG. 42 is a plot of repetition factor reduction FER.

The reduction repetition factor from 3 to 2 has 3 dB losses, The reduction repetition factor from 3 to 1 has 7 dB losses at BER=$10^{-6}$. See FIG. 42.

Impact of Simple Puncturing

Single puncturing works (⅔, ¾, ⅘) but have 1 db loss to algorithm of check node concatenation described in this report. See FIG. 43.

The Impact of Reducing the Decoding Iteration Number

Figure 43:
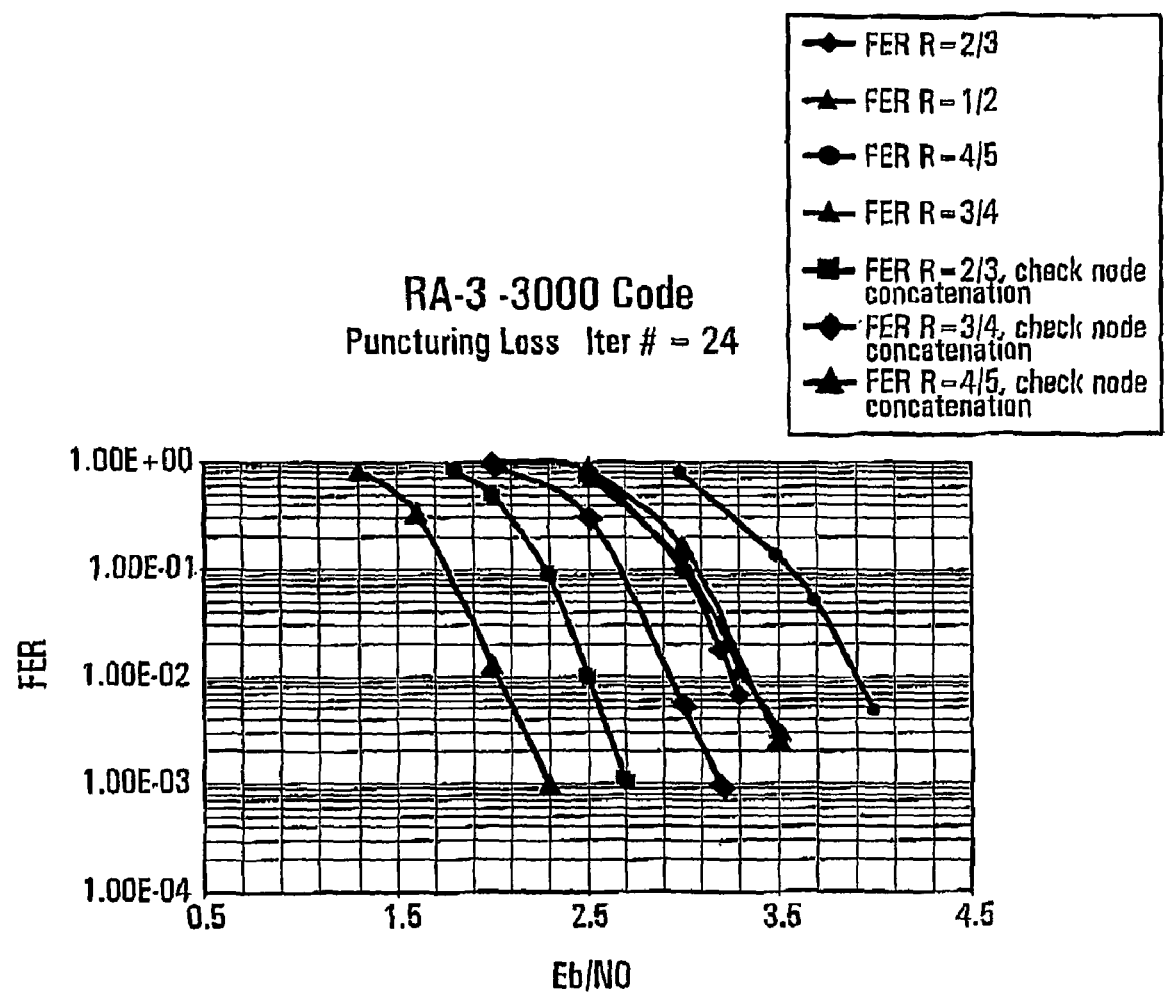
FIG. 43 is a plot of simple puncturing in RA-3 code—FER.
Figure 44:
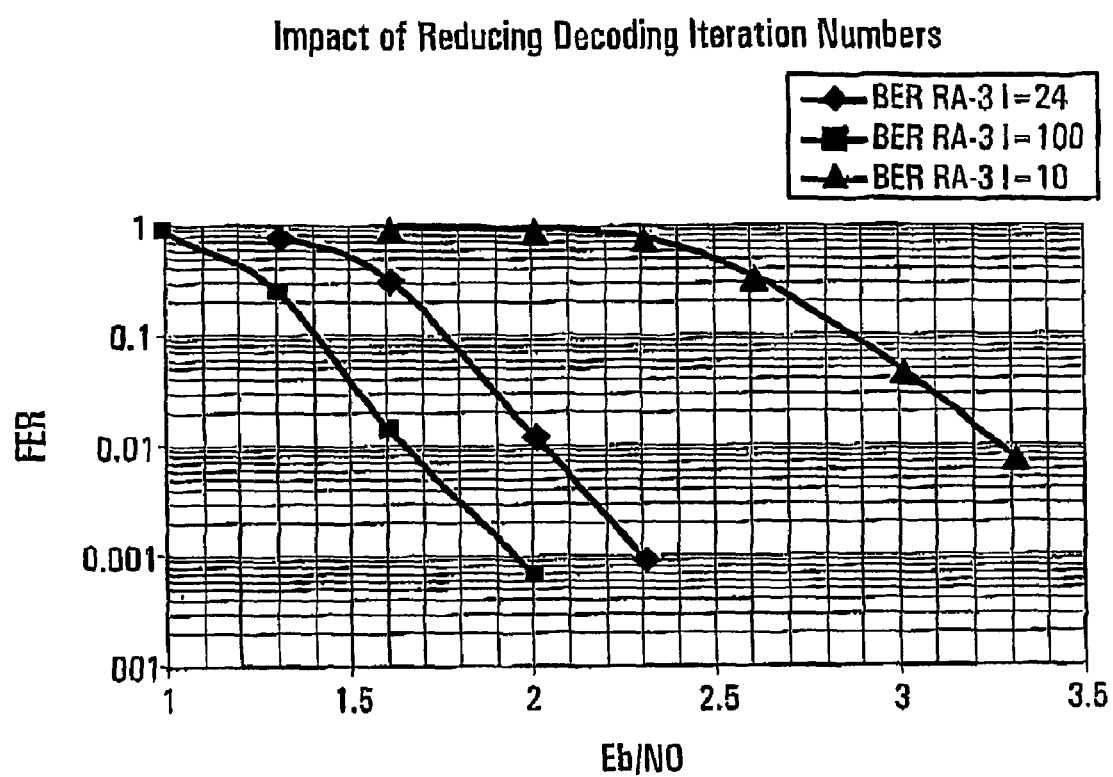
FIG. 44 is a plot of performance from iteration number—FER.
Figure 45:
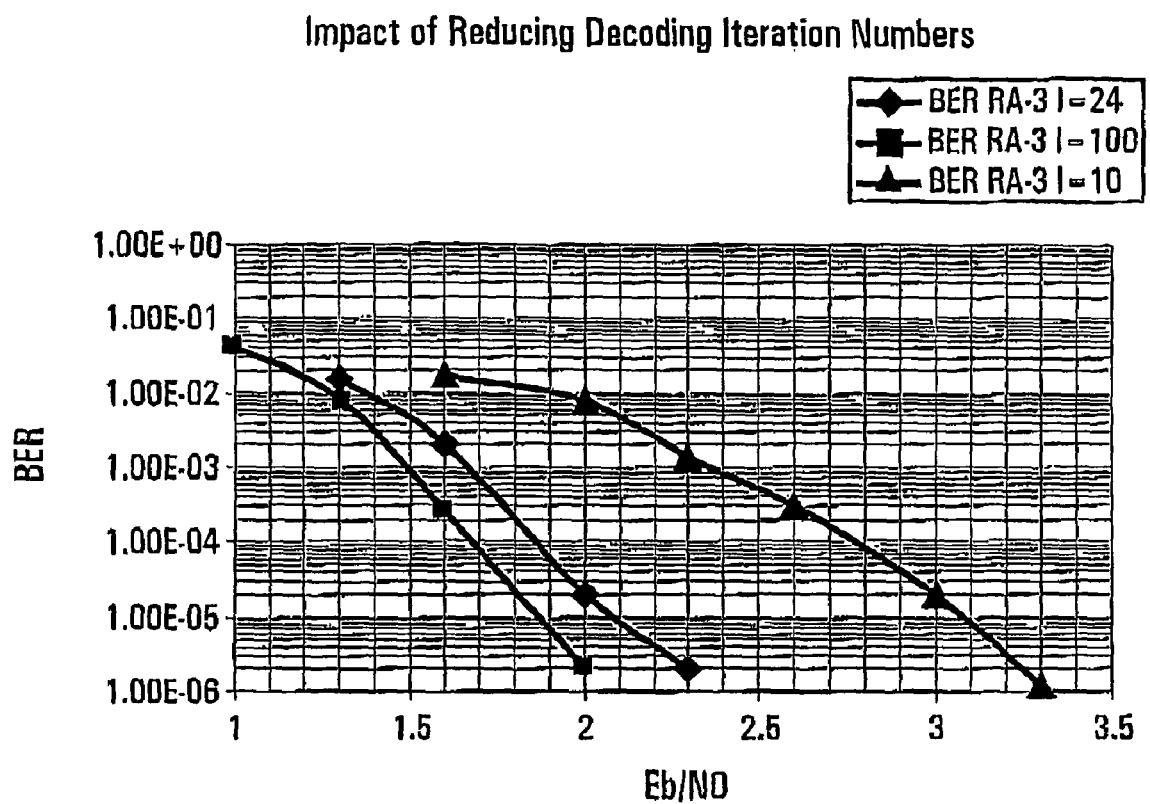
FIG. 45 is a plot of performance from iteration number—BER.

Examples are is shown in FIGS. 43, 44 and 45. The reducing iteration number from 100 to 24 has 0.3 dB losses. The reducing iteration number from 100 to 10 has 1 dB losses at BER=$10^{-6}$.

Numerous modifications and variations of the present invention are possible in light of the above teachings. It is therefore to be understood that within the scope of the appended claims, the invention may be practiced otherwise than as specifically described herein.

The invention claimed is:

1. An LDPC encoder with linear complexity adapted to produce a systematic output and a parity output, the encoder comprising:
a repeater that implements an irregular repetition code;
an interleaver that performs interleaving on the repeater output;
an accumulator performing accumulations on outputs of the interleaver and outputting the parity output.

2. The LDPC encoder of claim 1 wherein the interleaver is either an S-random or congruential interleaver.

3. The LDPC encoder of claim 1 wherein the accumulator performs irregular accumulations.

4. The LDPC encoder of claim 1 further comprising a parallel to serial function between the repeater and the interleaver.

5. The LDPC encoder of claim 1 parameterized by a repetition pattern for the repeater, and a permutation for the interleaver.

6. The LDPC encoder of claim 1 wherein the repetition pattern and the permutation are optimized.

7. The LDPC encoder of claim 1 wherein the S-random interleaver is a semi-random algorithm with rejection providing s pre-interleaving sequential bits with the post-interleaving distance of not less than s, $$s \leq \sqrt{\frac{N}{2}}.$$

8. The LDPC encoder of claim 1 wherein the LDPC code can be represented by a parity check matrix with dual diagonal structure:

$$H_{b2} = [h_b | H'_{b2}]$$

$$= \begin{bmatrix} h_b(0) & 1 & & & & \\ h_b(1) & 1 & 1 & & 0 & \\ \vdots & & 1 & \ddots & & \\ \vdots & & & \ddots & 1 & \\ \vdots & & 0 & & 1 & 1 \\ h_b(m_b - 1) & & & & & 1 \end{bmatrix}$$

9. The LDPC encoder of claim 1 wherein the entire code is representable in matrix form as follows:

$$H = \begin{bmatrix} P_{0,0} & P_{0,1} & P_{0,2} & \ldots & P_{0,n_b-2} & P_{0,n_b-1} \\ P_{1,0} & P_{1,1} & P_{1,2} & \ldots & P_{1,n_b-2} & P_{1,n_b-1} \\ P_{2,0} & P_{2,1} & P_{2,2} & \ldots & P_{2,n_b-2} & P_{2,n_b-1} \\ \vdots & \vdots & \vdots & \ldots & \vdots & \vdots \\ P_{m_b-1,0} & P_{m_b-1,1} & P_{m_b-1,2} & \ldots & P_{m_b-1,n_b-2} & P_{m_b-1,n_b-1} \end{bmatrix} = P^{H_b}$$

where H is a matrix of size m-by-n, where n is the length of the code and m is the number of parity check bits in the code, where $P_{i,j}$ is one of a set of z-by-z right-shifted identity matrices or a z-by-z zero matrix;
the matrix H is expanded from a binary base matrix $H_b$ of size $m_b$-by-$n_b$, where $n=z \cdot n_b$ and $m=z \cdot m_b$, and z is a positive integer, the base matrix is expanded by replacing each 1 in the base matrix with a z-by-z right-shifted identity matrix, and each 0 with a z-by-z zero matrix;
partitioning $H_b$ into two sections where $H_{b1}$ corresponds to the systematic bits, and $H_{b2}$ corresponds to the parity-check bits;
partitioning section $H_{b2}$ into two sections, where vector $h_b$ has odd weight, and $H'_{b2}$ has a dual-diagonal structure with matrix elements at row i, column j equal to 1 for i=j, 1 for i=j+1, and 0 elsewhere:

$$H_{b2} = [h_b | H'_{b2}]$$

$$= \begin{bmatrix} h_b(0) & 1 & & & & \\ h_b(1) & 1 & 1 & & 0 & \\ \vdots & & 1 & \ddots & & \\ \vdots & & & \ddots & 1 & \\ \vdots & & 0 & & 1 & 1 \\ h_b(m_b - 1) & & & & & 1 \end{bmatrix}$$

where $h_b(0)=1$, $h_b(m-1)=1$, and a third value $h_b(j)$, $0 \leq j < (m_b-1)$ equal to 1.

10. The LDPC encoder of claim 1 further adapted to allow construction for a set of different coding rates based on a common encoder/decoder featuring rate compatible check node processor construction and puncture based rate matching with check node concatenation.

11. An LDPC decoder comprising:
a parallel node processing structure, adapted for any selected code rate and interleaver selection, for use in decoding a code implemented in accordance with claim 1.

12. An LDPC encoder implementing an LDPC code that can be represented by a parity check matrix with dual diagonal structure:

$$H_{b2} = [h_b | H'_{b2}]$$

$$= \begin{bmatrix} h_b(0) & 1 & & & & \\ h_b(1) & 1 & 1 & & 0 & \\ \vdots & & 1 & \ddots & & \\ \vdots & & & \ddots & 1 & \\ \vdots & & 0 & & 1 & 1 \\ h_b(m_b - 1) & & & & & 1 \end{bmatrix}$$

13. The LDPC encoder of claim 12 wherein the entire code is representable in matrix form as follows:

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}.$$

14. A method of performing LDPC encoding to determine a parity sequence p given an information sequence s comprising:

dividing the information sequence s into $k_b = n_b - m_b$ groups of z bits—let this grouped s be denoted u, $u = [u(0)\ u(1) \ldots u(k_b-1)]$, where each element of u is a column vector as follows $u(i) = [s_{iz}\ s_{iz+1} \ldots s_{(i+1)z-1}]^T$ using a model matrix $H_b$, determining the parity sequence p in groups of z—let the grouped parity sequence p be denoted v, $v = [v(0)\ v(1) \ldots v(m_b-1)]$, where each element of v is a column vector as follows $v(i) = [p_{iz}\ p_{iz+1} \ldots p_{(i+1)z-1}]^t$ performing an initialization step to determine v(0);
performing recursion to determine v(i+1) from v(i), $0 \leq i \leq m_b - 2$.

15. The method of claim 14 wherein:
an expression for v(0) is derived by summing over the rows of $H_b$ to obtain $$P_{p(x,k_b)}v(0) = \sum_{j=0}^{k_b-1} \sum_{i=0}^{m_b-1} P_{p(i,j)}u(j) \qquad (1)$$

where x, $1 \leq x \leq m_b - 2$, is the row index of $h_b$ where the entry is nonnegative and unpaired, and $P_i$ represents the z×z identity matrix circularly right shifted by size i. Equation (1) is solved for v(0) by multiplying by and $P_{p(x,k_b)}^{-1}$, since $P_{p(x,k_j)}^{-1} = P_{z-p(x,k_j)}$ since $p(x,k_b)$ represents a circular shift.

16. The method of claim 15 wherein the recursion is defined according to:

$$v(1) = \sum_{j=0}^{k_b-1} P_{p(i,j)}u(j) + P_{p(i,k_b)}v(0),\ i = 0, \qquad (2)$$

$$v(i+1) = v(i) + \sum_{j=0}^{k_b-1} P_{p(i,j)}u(j) + P_{p(i,k_b)}v(0), \qquad (3)$$

$i = 1, \ldots, m_b - 2$ where $P_{-1} \equiv 0_{z \times z}$.

* * * * *

UNITED STATES PATENT AND TRADEMARK OFFICE
CERTIFICATE OF CORRECTION

PATENT NO. : 7,831,883 B2
APPLICATION NO. : 11/547078
DATED : November 9, 2010
INVENTOR(S) : Wen Tong et al.

It is certified that error appears in the above-identified patent and that said Letters Patent is hereby corrected as shown below:

Column 4, line 45, "... decoder structures;" should be --... decoder structure;--;

Column 11, line 62, "... with B-presentation." should be --... with E-presentation.--;

Column 11, line 64, "Stimulation and Turbo-Code Comparison" should be --Simulation and Turbo-Code Comparison--;

Column 21, claim 14, line 29, "$v(i)=[p_{iz}\ p_{iz+1}\ ...\ p_{(i+1)z-1}]^{i}$" should be --$v(i)=[p_{iz}\ p_{iz+1}\ ...\ p_{(i+1)z-1}]^{T}$--;

Column 22, claim 15, lines 13-14, "... multiplying by and $P_{p(x,k_b)}^{-1}$, since $P_{p(x,k_j)}^{-1} = P_{z\cdot p(x,k_i)}$ since $p(x,k_b)$ represents ..." should read --... multiplying by $P^{-1}_{p(x,k_b)}$, and $P^{-1}_{p(x,k_b)} = P_{z\cdot p(x,k_b)}$ since $p(x,k_b)$ represents ...--; and Column 22, claim 16, line 30, "$P_{-1} \equiv 0_{z<z}$." should be --$P_{-1} \equiv 0_{zxz}$.--.

Signed and Sealed this
Twenty-second Day of February, 2011

David J. Kappos
*Director of the United States Patent and Trademark Office*